United States Patent
Kato et al.

(10) Patent No.: US 6,349,104 B1
(45) Date of Patent: Feb. 19, 2002

(54) STRIPE-GEOMETRY HETEROJUNCTION LASER DIODE DEVICE

(75) Inventors: Hisaya Kato, Takahama; Yoshitaka Gotoh, Toyoake; Katsunori Abe, Chita-gun; Kinya Atsumi, Okazaki; Takekazu Terui, Tokai; Noriyuki Matsushita, Nagoya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/087,275

(22) Filed: May 29, 1998

(30) Foreign Application Priority Data

May 30, 1997 (JP) .............................. 9-142270
Jul. 17, 1997 (JP) .............................. 9-192793

(51) Int. Cl.[7] .............................. H01S 3/04; H01S 5/00
(52) U.S. Cl. .................................. 372/36; 372/46
(58) Field of Search ........................ 372/36, 43, 44, 372/45, 46, 50, 96

(56) References Cited

U.S. PATENT DOCUMENTS

| | | | | |
|---|---|---|---|---|
| 4,092,614 A | * | 5/1978 | Sakuma et al. | 372/36 |
| 4,604,753 A | * | 8/1986 | Sawai | 372/36 |
| 4,791,647 A | * | 12/1988 | Sugou | 372/45 |
| 4,914,668 A | * | 4/1990 | Nagai et al. | 372/36 |
| 5,016,083 A | * | 5/1991 | Ishii et al. | 372/36 |
| 5,195,103 A | * | 3/1993 | Hinton et al. | 372/96 |
| 5,249,733 A | * | 10/1993 | Brady et al. | 228/180.22 |
| 5,345,466 A | * | 9/1994 | Macomber | 372/96 |
| 5,355,384 A | | 10/1994 | Inoue et al. | 372/46 |
| 5,559,819 A | | 9/1996 | Abe | 372/46 |
| 5,623,509 A | | 4/1997 | Iwano et al. | 372/45 |

FOREIGN PATENT DOCUMENTS

| | | | |
|---|---|---|---|
| JP | 59-094864 | * | 5/1984 |
| JP | 8-08494 | | 1/1996 |
| JP | 9-069665 | | 3/1997 |

OTHER PUBLICATIONS

Neamen, Semiconductor Physics and Devices: Basic Principles, Boston: Irwin, 1992. (no month available).*

* cited by examiner

*Primary Examiner*—Quyen Leung
(74) *Attorney, Agent, or Firm*—Pillsbury Winthrop LLP

(57) ABSTRACT

A high power stripe-geometry heterojunction laser diode device is provided which may be employed in a radar system designed to measure the distance to a target. The laser diode device has an electric circuit path extending from a first electrode connected to a voltage source to a second electrode connected to ground and features addition of a resistance of 1 mΩ or more to the electric circuit path to provide uniform current distribution in an active layer for emitting a high density laser beam.

2 Claims, 28 Drawing Sheets

STRIPE-GEOMETRY HETEROJUNCTION LASER DIODE DEVICE

BACKGROUND OF THE INVENTION

1. Technical Field of the Invention

The present invention relates generally to a laser diode, and more particularly to an improved structure of a heterojunction laser diode suitable for radar systems designed to measure the distance to a target.

2. Background of Related Art

In recent years, automotive radar systems have been proposed which measure the distance between a system-equipped vehicle and a preceding vehicle using a laser diode (i.e., a semiconductor diode) and output an alarm signal and/or apply brakes when the system-equipped vehicle is too close to the preceding vehicle. Such systems are designed to detect an object 100 m ahead, requiring laser diodes capable of being excited by pulse voltage to output a beam of light of several tens of watts (W). Specifically, unlike a low power laser diode, as shown in FIG. 26, which emits a laser beam of several milliwatts (mW), a high power laser diode, as shown in FIG. 27, has a wider light-emitting portion (i.e., a stripe width) of an active layer, which causes difficulty in producing a laser beam approximating a circular shape.

In order to alleviate the above problem, U.S. Pat. No. 5,559,819 filed on Apr. 18, 1995, assigned to the same assignee as that of this application teaches a semiconductor laser in which the sum of thicknesses of an active layer and an optical guide layer is set to 1.5 $\mu$m or more for decreasing an ellipticity of a laser beam (i.e., a ratio of a major axis to a minor axis of a cross section of the laser beam). The decrease in ellipticity of the laser beam is achieved by reducing the diffraction of light in a thicknesswise direction of an optical guide layer to narrow the laser beam in that direction without changing the diffraction of light in a widthwise direction of the optical guide layer to approximate the cross sectional shape of the laser beam to a circle. Thus, there is also need for narrowing laser beam in the widthwise direction of the optical guide layer.

Specifically, a high power laser diode operates in a multimode, and the width of a light-emitting portion (i.e., a stripe width) of an active layer is great, therefore, the current flowing through the active layer has, as shown in FIG. 30, the Gaussian distribution which causes an equiphase surface of light in the laser diode to be deformed, resulting in deterioration in coherence. This will cause an output laser beam to be widened undesirably so that a far-field pattern (FFP) becomes wide, the density of an output laser beam at a remote location thereby being decreased.

SUMMARY OF THE INVENTION

It is therefore an object of the present invention to provide an improved structure of a high power laser diode capable of emitting a high density laser beam.

In in-depth analysis of internal structure of a high power laser diode to achieve the above object, the inventors of this application have found that addition of a resistor to a current path of the high power laser diode causes current distribution in an active layer (usually, Gaussian distribution) to be uniform or flat, as shown by a solid line in FIG. 31.

Specifically, a high power laser diode having a wider stripe width can be viewed, as shown in FIG. 32, as a circuit having a plurality of diodes $D_1, D_2, \ldots D_n$ arranged in parallel. In this circuit, it is conceivable that a large amount of current flows through each of the diodes $D_1, D_2, \ldots D_n$ when energized, and current values $I_1, I_2, \ldots I_n$ all exhibit the Gaussian distribution. In contrast, it has been observed that when resistors R are disposed, as shown in FIG. 33, between the diodes $D_1, D_2, \ldots D_n$ and the ground, it will cause the current flows to be slowed down so that they show a constant value over a wide range within a stripe width. The present invention was made based on this fact.

According to a first aspect of the present invention, there is provided a stripe-geometry heterojunction laser diode device having a stripe width of 100 $\mu$m or more which comprises: (a) a laser diode chip including (1) a first electrode layer connected to a voltage source, (2) a second electrode layer connected to ground, and (3) an active layer disposed between the upper and the lower electrode layers to emit a laser beam when energized; and (b) a resistance layer having a resistance of 1 m$\Omega$ or more, the resistance layer being disposed within an electric path extending from the first electrode layer to the second electrode layer through the active layer.

In the preferred mode of the invention, the resistance layer is disposed between the second electrode layer and the ground.

The resistance layer may alternatively be disposed between the first electrode layer and the voltage source.

The resistance layer is made of one of a GaAs-based material, a Si-based material, and an InP-based material.

A base material of the resistance layer may be identical with a base material of the laser diode chip.

The resistance layer has at least one side surface. The laser diode chip has at least one side surface. The resistance layer is soldered to a bottom of the laser diode chip with the side surface of the resistance layer shifted from the side surface of the laser diode chip.

According to a second aspect of the invention, there is provided a stripe-geometry heterojunction laser diode device having a stripe width of 100 $\mu$m or more which comprises: (a) a laser diode chip emitting a laser beam when energized; (b) a base having disposed thereon the laser diode chip; and (c) a junction layer disposed between the laser diode chip and the base to join the laser diode chip to the base, the junction layer having a thickness which provides a resistance of 1 m$\Omega$ or more.

In the preferred mode of the invention, the thickness of the junction layer is 20 $\mu$m or more.

According to a third aspect of the invention, there is provided a stripe-geometry heterojunction laser diode device having a stripe width of 100 $\mu$m or more which comprises: (a) a laser diode chip emitting a laser beam when energized; (b) a base having disposed thereon the laser diode chip; and (c) a junction layer disposed between the laser diode chip and the base to join the laser diode chip to the base, the junction layer having formed therein a non-junction portion so as to produce a resistance of 1 m$\Omega$ or more.

In the preferred mode of the invention, the non-junction portion occupies in area 90% or more of the junction layer.

According to a fourth aspect of the invention, there is provided a stripe-geometry heterojunction laser diode device having a stripe width of 100 $\mu$m or more which comprises a laser diode chip emitting a laser beam when energized. The laser diode chip includes a substrate which is made of a base material of the laser diode chip and which has a resistance of 1 $\Omega$ or more.

The substrate has impurities which provides the resistance of 1 m$\Omega$ or more to the substrate.

The substrate may alternatively have a thickness which provides the resistance of 1 mΩ or more to the substrate.

According to a fifth aspect of the invention, there is provided a stripe-geometry heterojunction laser diode device having a stripe width of 100 µm or more which comprises: (a) a laser diode chip including (1) a first electrode layer connected to a voltage source, (2) a second electrode layer connected to ground, and (3) an active layer disposed between the upper and the lower electrode layers to emit a laser beam when energized; (b) an electric path extending from the first electrode layer to the second electrode layer through the active layer; and (c) a base having disposed thereon the laser diode chip, the base having a resistance of 1 mΩ or more and constituting a portion of the electric path between the second electrode layer and the ground.

In the preferred mode of the invention, the base is made of a material other than copper, silver, and gold.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 1:
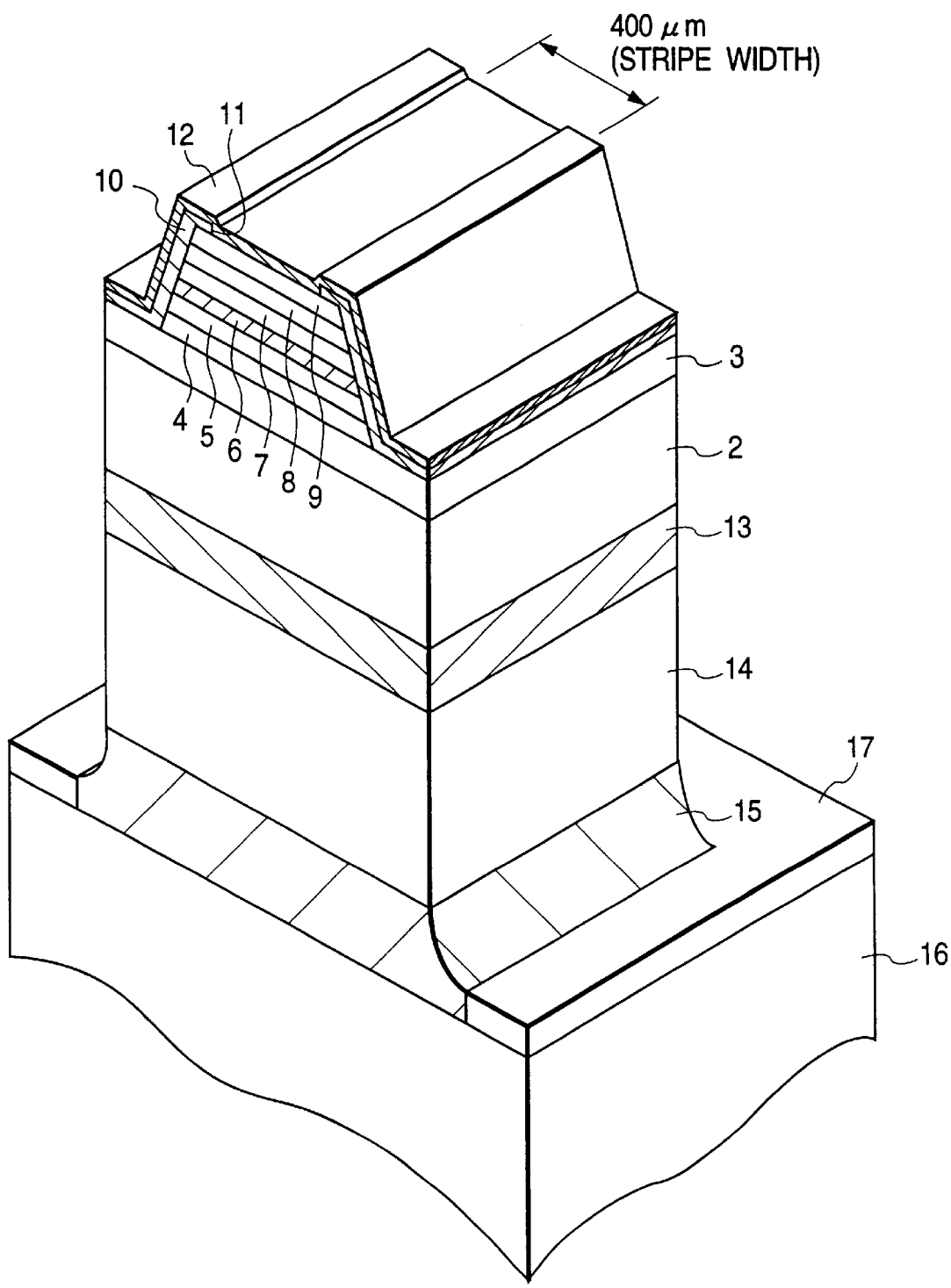
FIG. 1 is a perspective view which shows a heterojunction laser diode according to the first embodiment of the invention.
Figure 2:
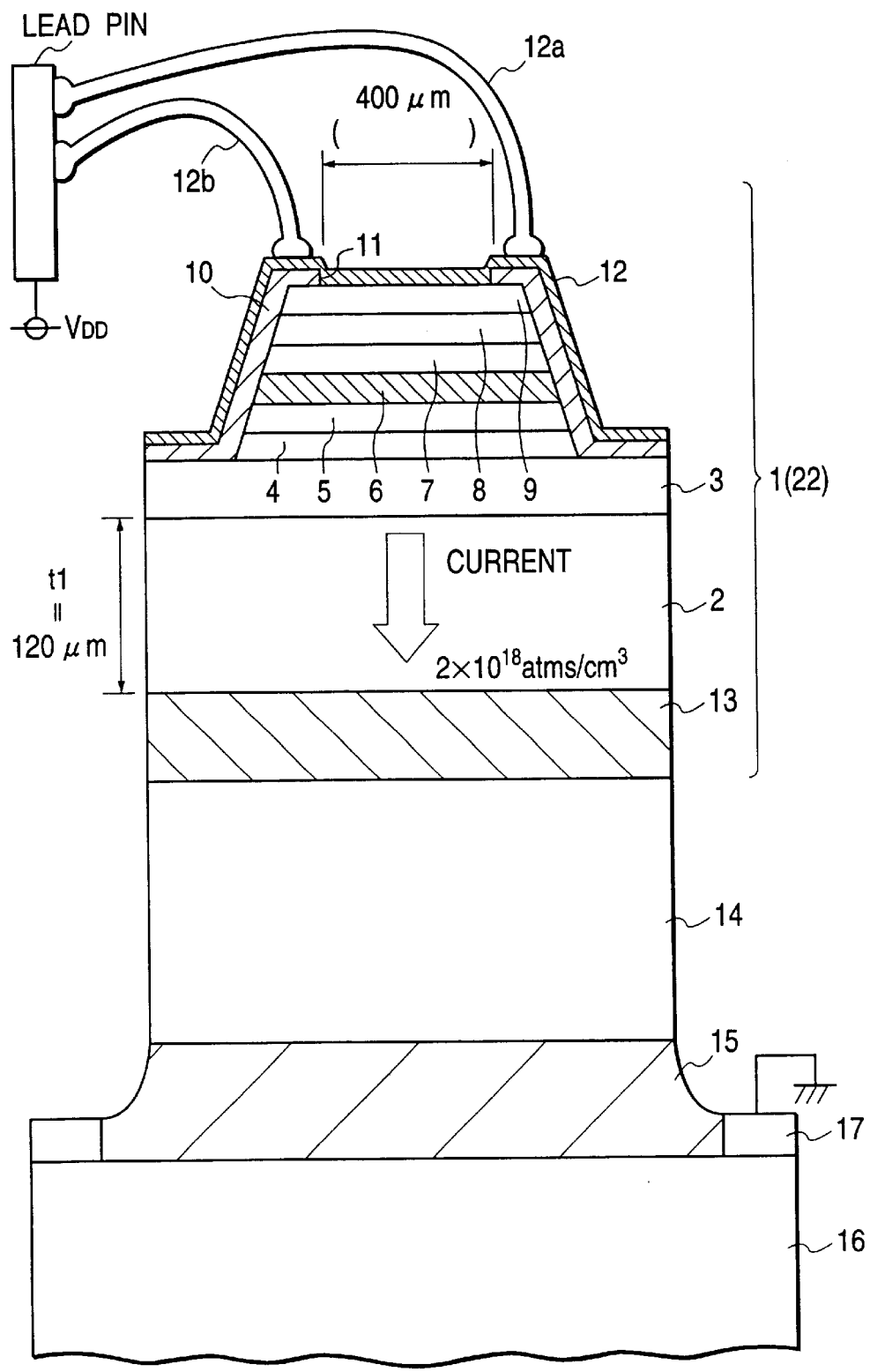
FIG. 2 is a longitudinal sectional view of FIG. 1.

Referring now to the drawings, wherein like reference numbers refer to like parts, particularly to FIGS. 1 and 2, there is shown a high power oxide stripe-geometry heterojunction laser diode, i.e., a gain-guided heterojunction laser diode according to the present invention.

The laser diode includes a diode body 1 (i.e., a laser diode chip 22), as shown in FIG. 2, which consists of an n-GaAs substrate 2, and n-GaAs layer 3, an n-$Al_{0.4}Ga_{0.6}As$ clad layer 4, an n-$Al_{0.2}Ga_{0.8}As$ optical guide layer 5, an active layer 6 made of multi-quantum well structure of $Al_{0.2}Ga_{0.8}As/GaAs$, a p-$Al_{0.2}Ga_{0.8}As$ optical guide layer 7, a p-$Al_{0.4}Ga_{0.6}As$ clad layer 8, and a p-GaAs contact layer 9.

The active layer 6 consists of five $Al_{0.2}Ga_{0.8}As$ layers and six GaAs layers which are alternately laminated. The clad layer 4, the optical layer 5, the active layer 6, the optical layer 7, the clad layer 8, and the contact layer 9 form a mesa. The active layer 6 is coated on a front end surface, as viewed in FIG. 1, with a low reflective film and on a rear end surface with a high reflective film.

The n-GaAs substrate 2 has a thickness $t_1$ of 120 µm and contains impurities of $2\times10^{18}$ atms/cm³. The n-GaAs layer 3 has a thickness of 500 nm (0.5 µm). The n-$Al_{0.4}Ga_{0.6}As$ clad layer 4 has a thickness of 1 µm. The n-$Al_{0.2}Ga_{0.8}As$ optical guide layer 5 has a thickness of 0 to 2.25 µm. In the active layer 6, each of the $Al_{0.2}Ga_{0.8}As$ layers has a thickness of 7.5 nm (0.0075 μm), and the total thickness of the five $Al_{0.2}Ga_{0.8}As$ layers comes to 37.5 nm (=7.5 nm×5). Each of the GaAs layers has a thickness of 15 nm (0.015 μm), and the total thickness of the six GaAs layers comes to 90 nm (=15 nm×6). The thickness of the active layer 6, thus, comes to 127.5 nm (0.1275 μm).

The p-$Al_{0.2}Ga_{0.8}As$ optical guide layer 7 has a thickness of 0 to 2.25 μm. The p-$Al_{0.4}Ga_{0.6}As$ clad layer 8 has a thickness of 1 μm. The p-GaAs contact layer 9 has a thickness of 0.8 μm.

Figure 29:
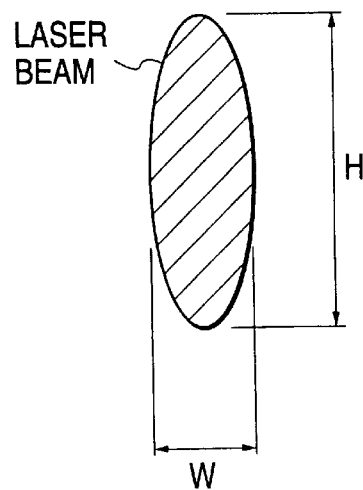
FIG. 29 is a sectional view which shows a laser beam emitted by the laser diode of FIG. 27.
Figure 30:
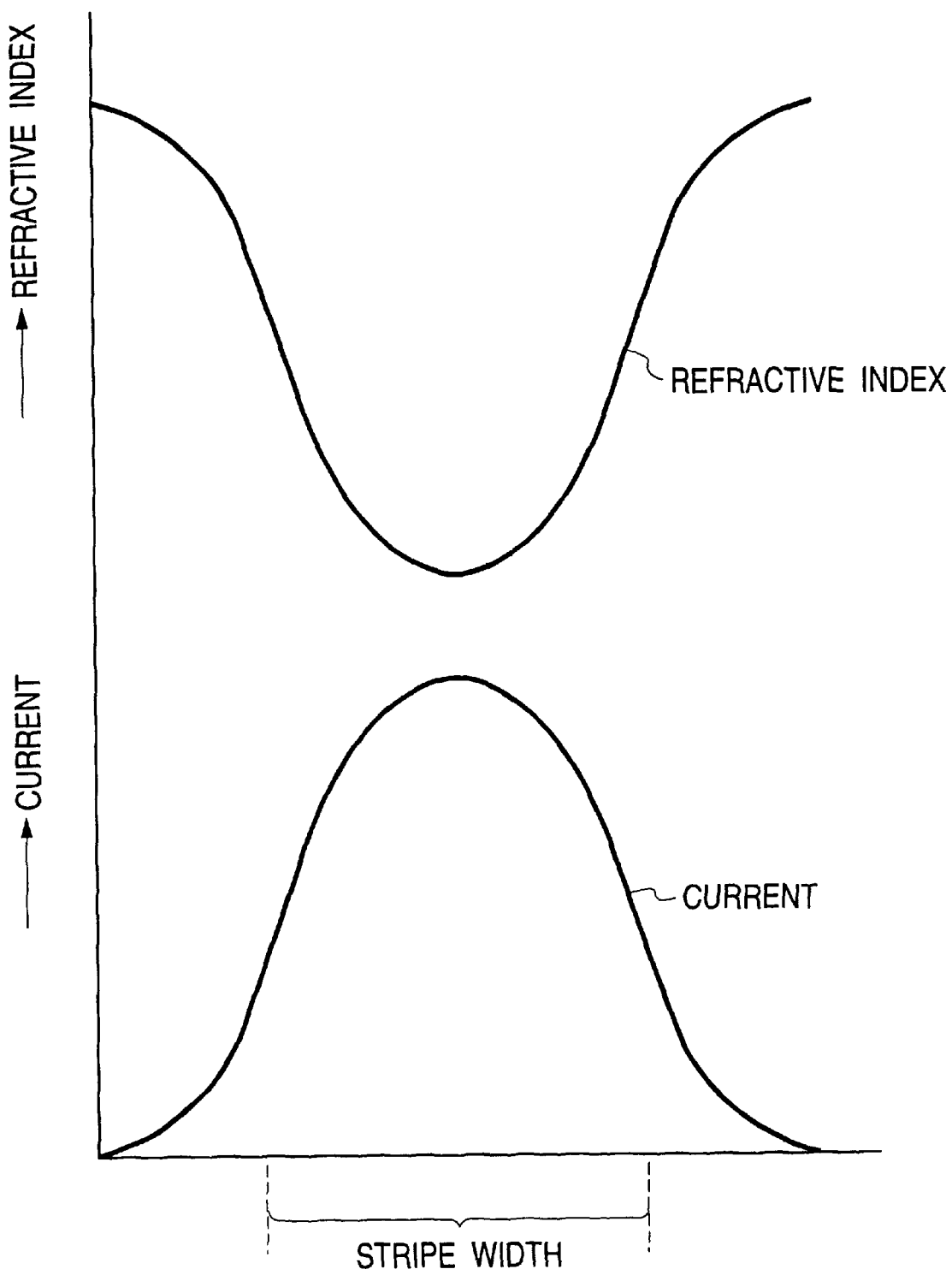
FIG. 30 is a graph which shows refractive index distribution and current distribution in a conventional high power laser diode.

In this embodiment, the thickness of the active layer 6 is, as described above, 127.5 nm, and the total thickness of the active layer 6 and the optical guide layers 5 and 7 is 1.5 μm or more, thereby decreasing an ellipticity (an H-W ratio in FIG. 29) of a cross section of a laser beam.

The refractive index (mean refractive index) of the active layer 6 is 3.6. The refractive indexes of the n-$Al_{O.2}Ga_{0.8}As$ optical guide layer 5 and the p-$Al_{0.2}Ga_{0.8}As$ optical guide layer 7 are 3.5. The refractive indexes of the n-$Al_{0.4}Ga_{0.6}As$ clad layer 4 and the p-$Al_{0.4}Ga_{0.6}As$ clad layer 8 are 3.3.

The diode body 1 also includes insulating films 10 made of $SiO_2$ and an upper electrode layer 12 made of Cr/Pt/Au laminates. The insulating films 10 formed on both side portions of the n-GaAs layer 3 and extend to upper side portions of the contact layer 9 through side surfaces of the layers 4 to 9 (i.e., on the mesa) so as to define a window 11 on an upper surface of the mesa. The upper electrode layer 12 is formed on the insulating films 10 and the window 11 in ohmic contact with the p-GaAs contact layer 9. The width of the window 11, or stripe width is 100 μm or more, e.g., 400 μm in this embodiment. The upper electrode layer 12 has a sheet resistance of, for example, 30 to 70 mΩ/m². The diode body 1 measures 500 μm×600 μm.

On the bottom of the n-GaAs substrate 2, an n-GaAs substrate 14 serving as a resistance layer is formed through an alloy layer 13 serving as a lower electrode layer and a junction layer. The n-GaAs substrate 14 has a thickness of 240 μm. On the bottom of the n-GaAs substrate 14, a Cu-made block 16 is disposed through an alloy layer 15. The Cu-made block 16 serves as a heatsink and has an upper peripheral surface plated with gold 17 which is in electric connection to ground and the alloy layer 15.

Au-made wires 12a and 12b are connected to the upper surface of the upper electrode layer 12. Note that the resistance of the upper electrode layer 12 is low, and the current density does not depend upon the number of the Au-made wires.

With the above arrangements, the alloy layer 13 is connected to ground through the n-GaAs substrate 14, the alloy layer 15, and the gold-plated layer 17. The n-GaAs-substrate 14 has a resistance of 1 mΩ or more.

Figure 3:
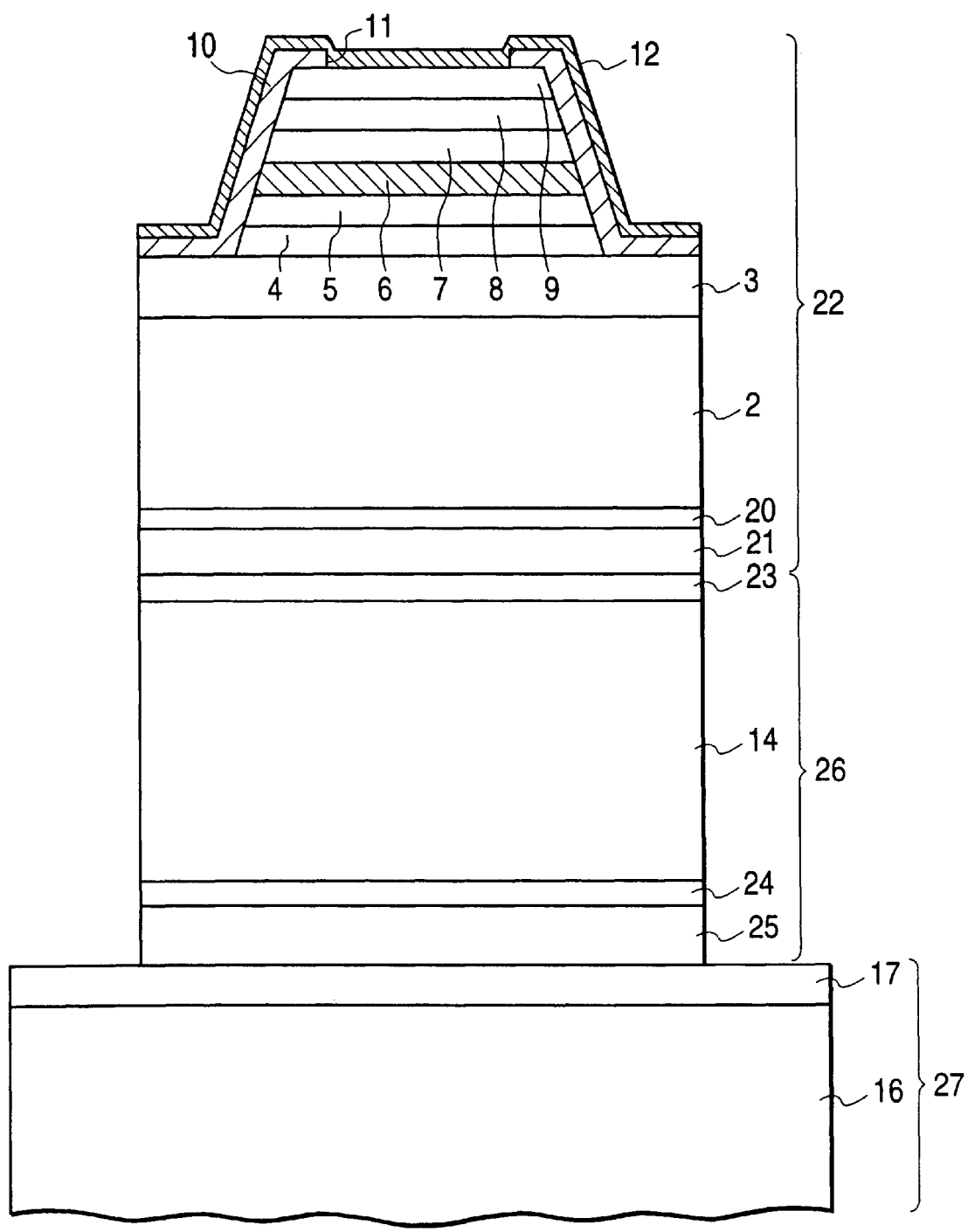
FIG. 3 is a longitudinal sectional view for explaining a manufacturing process of the laser diode in FIG. 1.

Next, a manufacturing method of the laser diode will be discussed below with reference to FIG. 3.

First, on the n-GaAs substrate 2, the n-GaAs layer 3, the n-$Al_{0.4}Ga_{0.6}As$ clad layer 4, the n-$Al_{0.2}Ga_{0.8}As$ optical guide layer 5, the $Al_{0.2}Ga_{0.8}As$/GaAs active layer 6, the p-$Al_{0.2}Ga_{0.8}As$ optical guide layer 7, the p-$Al_{0.4}Ga_{0.6}As$ clad layer 8, and the p-GaAs contact layer 9 are formed, in sequence, using MOCVD (Metal, Organic Chemical Vapor Deposition) techniques, after which the mesa is formed by etching.

On upper surfaces of the n-GaAs layer 3 and the mesa, a layer of $SiO_2$ (i.e., the insulating layers 10) is deposited by plasma CVD techniques, and then a central portion thereof is chemically etched away to form the window 11. On the insulating layers 10, the upper electrode layer 12 made of Cr/Pt/Au laminates is formed. On the bottom of the n-GaAs substrate 2, an electrode layer 20 is formed with Au-Ge/Ni/Au laminates. These layers are then subjected to an alloy process to form ohmic contacts with the electrode layers 12 and 20. On the electrode layer 20, a soldering layer 21 made of Au-Sn is vapor deposited. End walls of the thus formed block are polished or cleaved to complete the laser diode chip 22.

Besides the laser diode chip 22, an electrode layer 23 is formed with Cr/Pt/Au laminates on an upper surface of the n-GaAs substrate 14 having a thickness of 240 μm, while on a lower surface of the n-GaAs substrate 14, an electrode layer 24 is formed with Au-Ge/Ni/Au laminates. These layers are then subjected to an alloy process at 350° C. for two minutes to form ohmic contacts with the electrode layers 23 and 24. Subsequently, a soldering layer 25 made of Au-Sn is deposited on the electrode layer 24 to complete a resistance layer 26.

A base 27 consisting of the Cu-made block 16 and the gold-plated layer 17 is prepared. To the gold-plated layer 17, the resistance layer 26 and the laser diode chip 22 are attached in sequence by die-bonding. This causes the lower electrode layer 20 of the laser diode chip 22 and the upper electrode layer 23 of the resistance layer 26 to be alloyed with the soldering layer 21 to form the alloy layer 13, as shown in FIG. 2, and also causes the lower electrode layer 24 of the resistance layer 26 and a portion of the gold-plated layer 17 on the base 27 to be alloyed with the soldering layer 25 to form the alloy layer 15, as shown in FIG. 2.

In operation, application of the pulse voltage across the upper electrode layer 12 and the gold-plated layer 17 of the block 16 causes the pulse current to flow between the upper electrode layer 12 and the alloy layer 13, positive holes and electrons being thereby injected into the active layer 6 from the p-$Al_{0.4}Ga_{0.6}As$ clad layer 8 and the n-$Al_{0.4}Ga_{0.6}As$ clad layer 4, respectively, so that they are recombined to emit light. The light repeats reflection on the cleaved front and rear surfaces of the laser diode chip 22 and is amplified so that a laser beam is emitted from the front surface.

Figure 31:
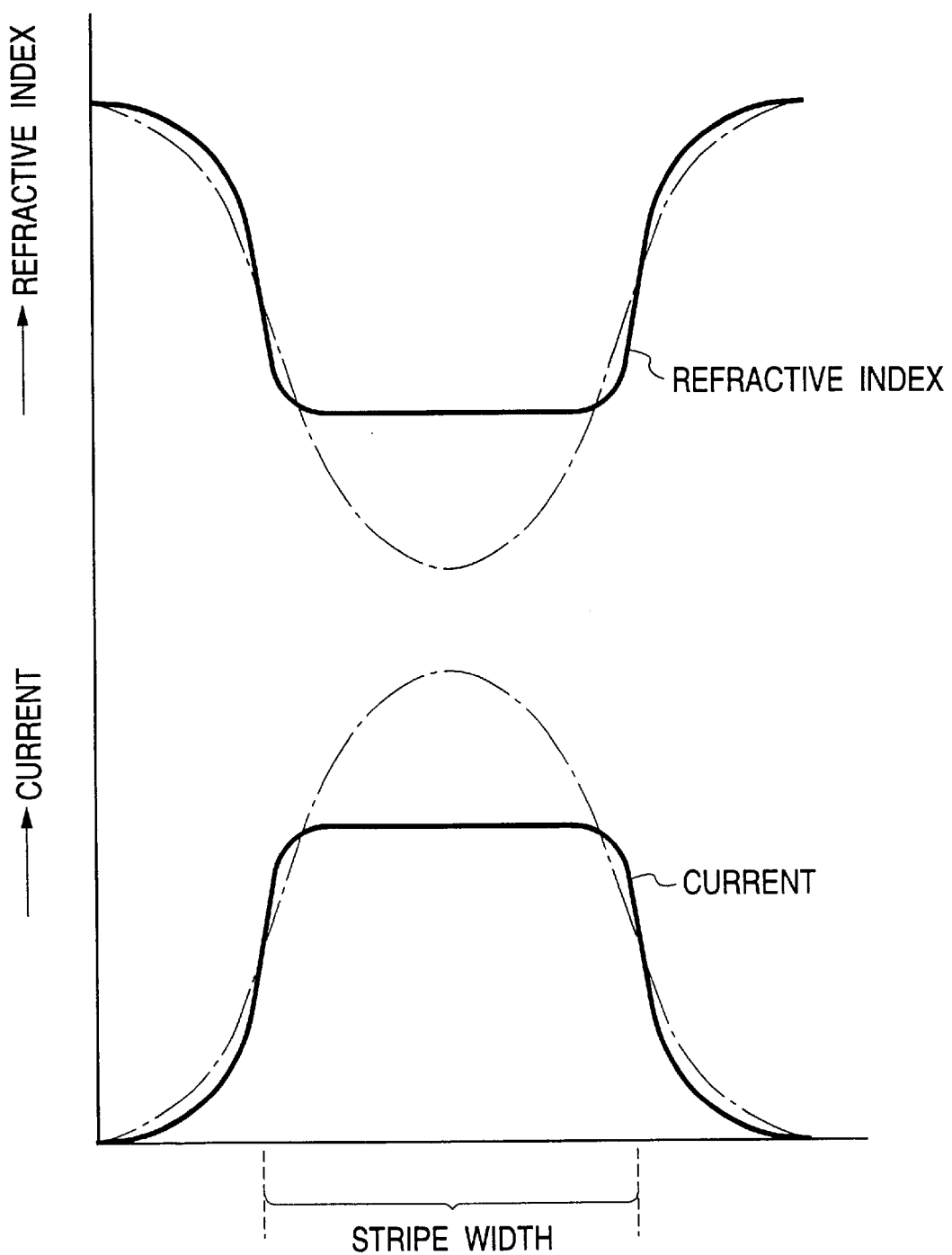
FIG. 31 is a graph which shows refractive index distribution and current distribution in a high power laser diode of the invention.
Figure 32:
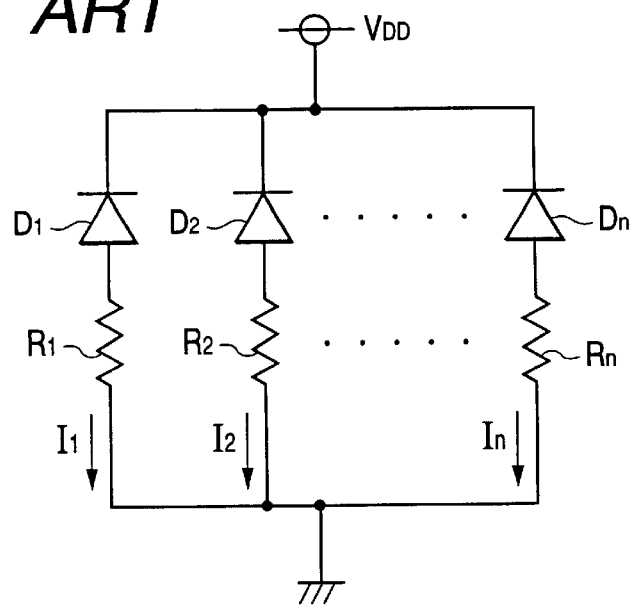
FIG. 32 is a diagram which shows an equivalent circuit of a conventional high power laser diode.
Figure 33:
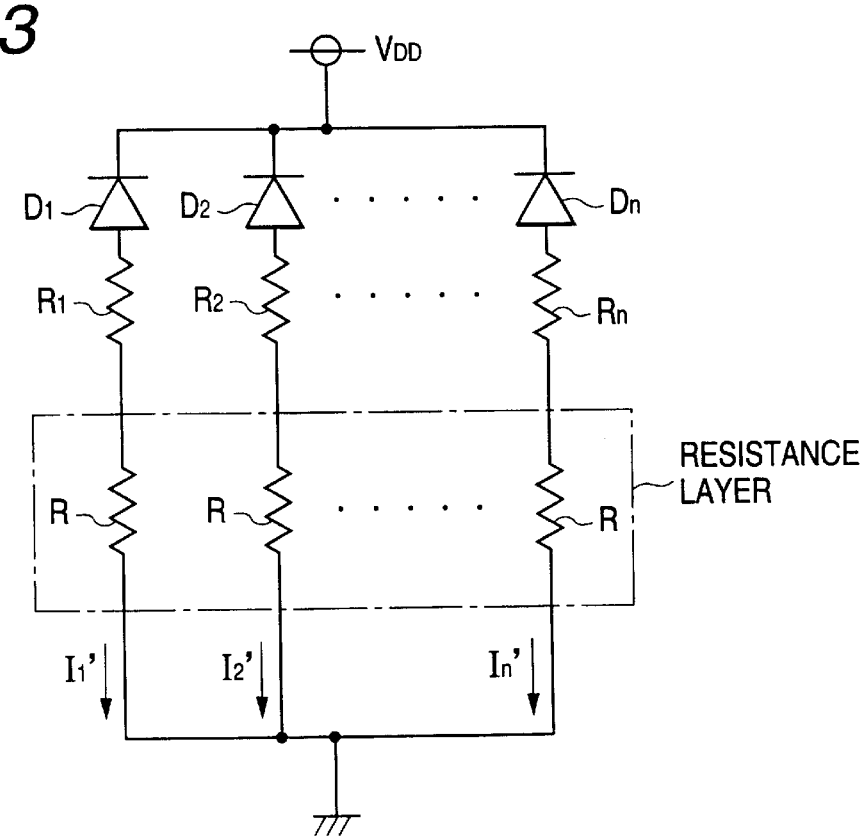
FIG. 33 is a diagram which shows an equivalent circuit of a high power laser diode of the invention.

The n-GaAs substrate 14 exhibits a small resistance (1 mΩ or more) between the diode body 1 (i.e., the laser diode chip 22) and the Cu-made block 16, thereby causing the current distribution, as shown by the solid line in FIG. 31, to be uniform or flat as compared with the Gaussian distribution shown by a broken line. This results in flat refractive index distribution of the active layer 6 so that an equiphase surface of light transmitted through the active layer 6 is oriented to the direction in which a beam of light is outputted, thereby improving the coherence and decreasing the divergence angle of the output beam to enhance the directivity thereof greatly.

Figure 4:
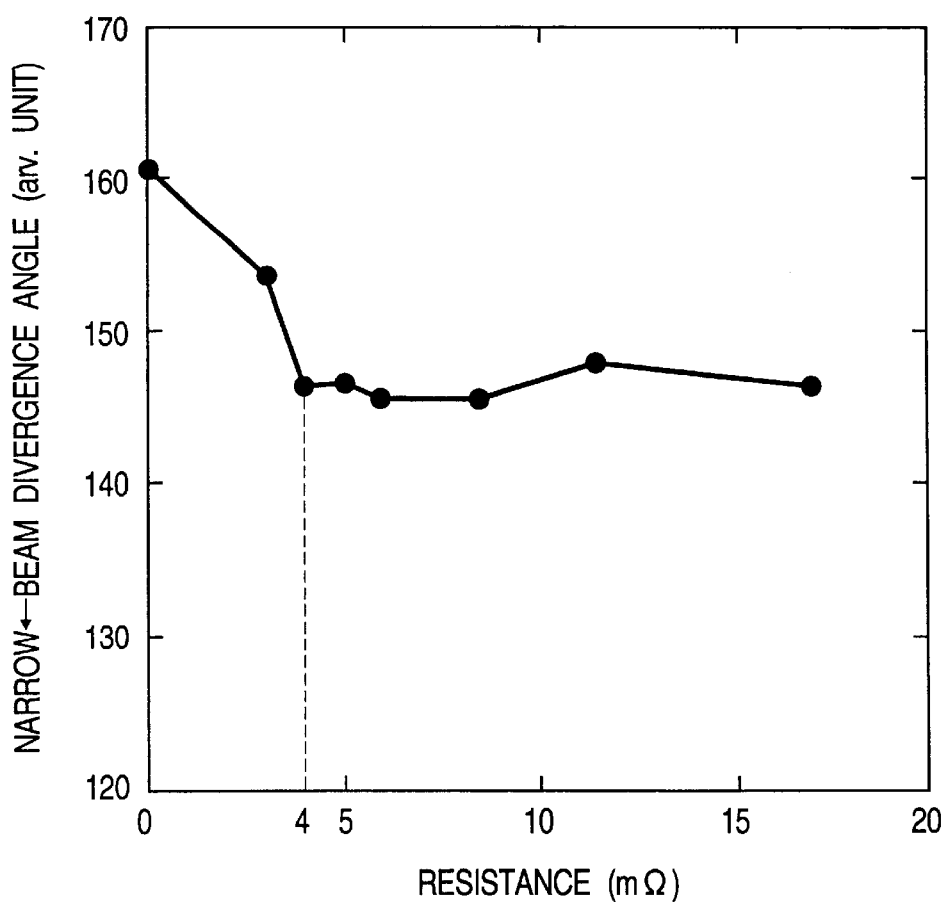
FIG. 4 is a graph which shows test results of measurement of the beam divergence angle in terms of electric resistance added by the n-GaAs substrate 14 of the laser diode in FIG. 1.

FIG. 4 illustrates test results of measurement of the beam divergence angle in terms of electric resistance added by the nGaAs substrate 14. The addition of resistance causes, as clearly shown in the graph, the beam divergence angle to be narrowed and almost kept constant in a resistance range of more than about 4 mΩ.

Note that the measurement in FIG. 4 was performed using a laser diode having a stripe width of 360 μm.

Figure 5:
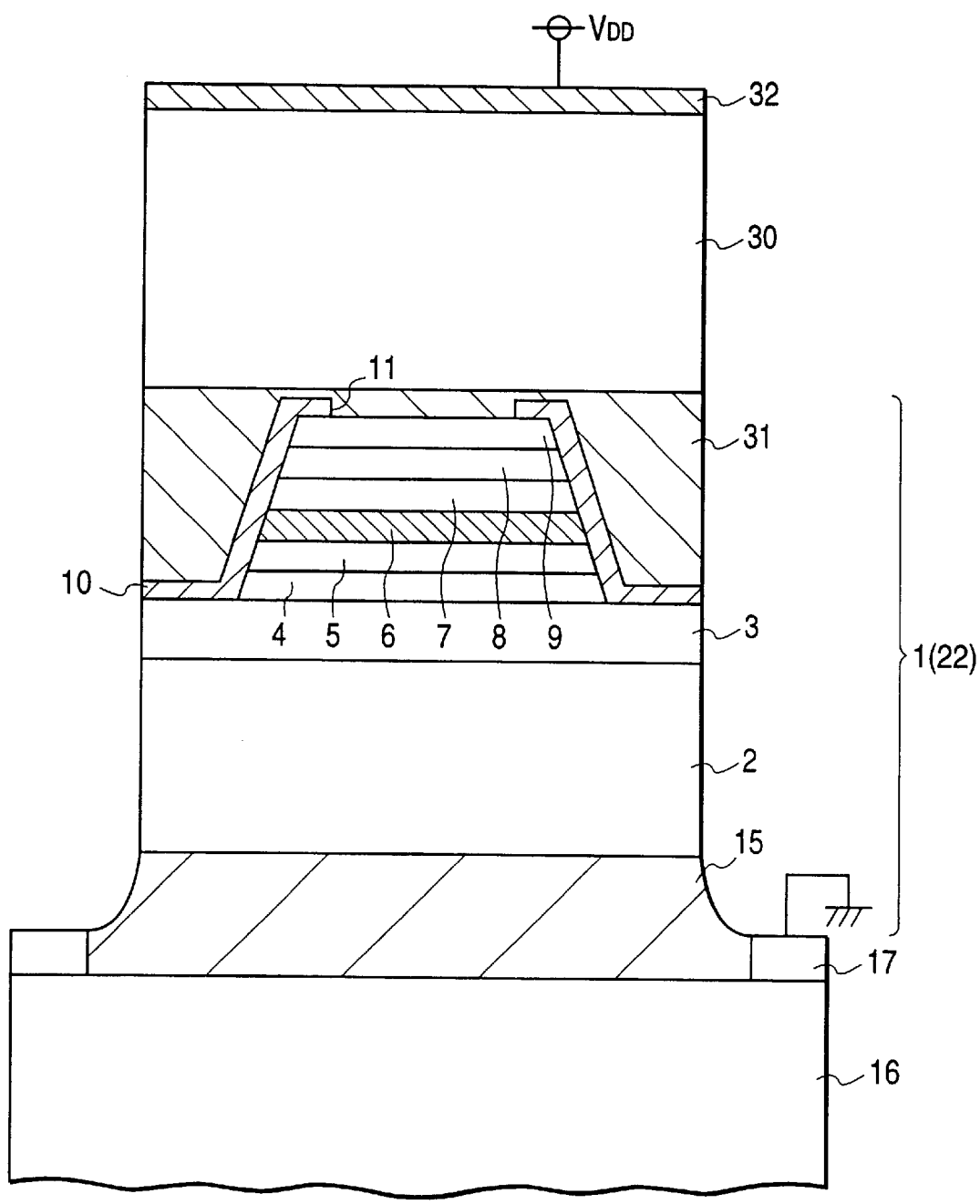
FIG. 5 is a longitudinal sectional view which shows the first modification of the laser diode in FIG. 1.

FIG. 5 shows a first modification of the heterojunction laser diode as described above.

In this modification, an n-GaAs substrate 30 serving as a resistance layer is formed on an upper electrode layer 31 of the laser diode chip 22. The n-GaAs substrate 30 has a resistance of 1 mΩ or more.

An alloy layer 31 is disposed between the n-GaAs substrate 30 and the laser diode chip 22. An electrode layer 32 is disposed on the n-GaAs substrate 30.

It is found that the structure in FIG. 1 is preferred to that in FIG. 5 for good FFP (Far-Field Pattern).

Figure 6:
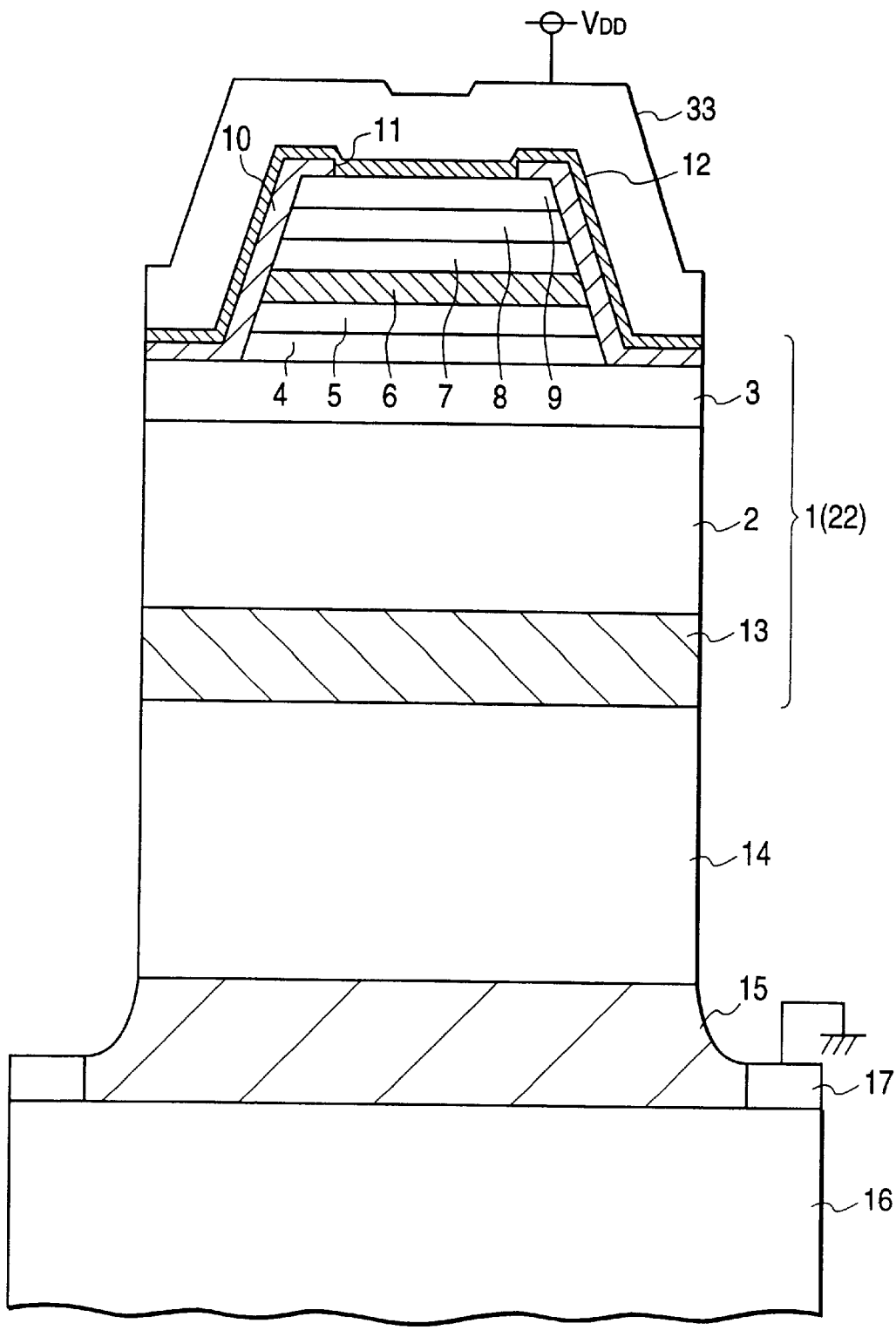
FIG. 6 is a longitudinal sectional view which shows the second modification of the laser diode in FIG. 1.

FIG. 6 shows a second modification of the heterojunction laser diode in FIG. 1.

An n-GaAs substrate 14 serving as a resistance layer is disposed on the bottom of the lower electrode layer 13 of the laser diode chip 22. A resistance layer 33 is disposed on an upper surface of the upper electrode layer 12. The total resistance of the n-GaAs substrate 14 and the resistance layer 33 is 1 mΩ or more.

Figure 7:
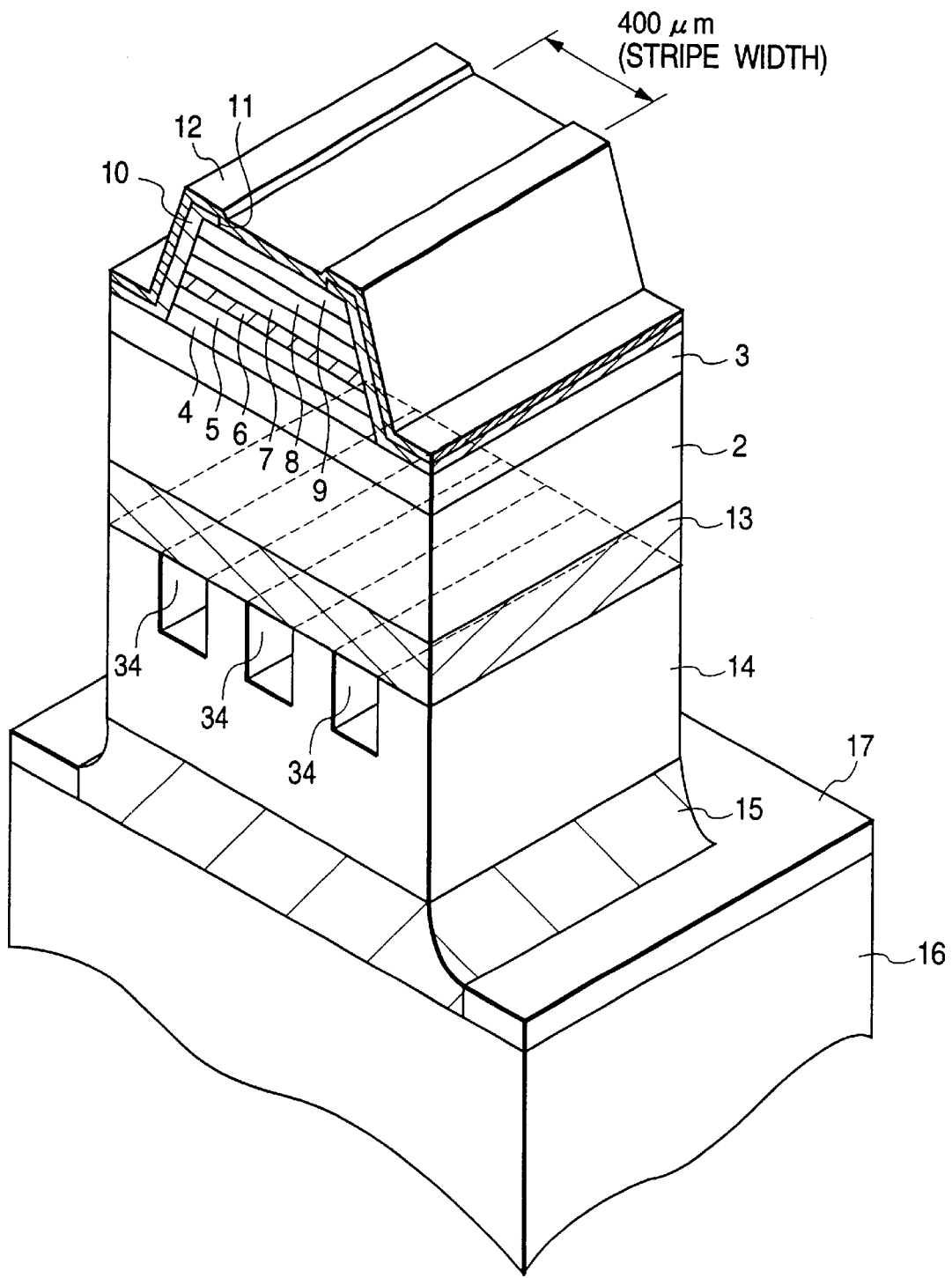
FIG. 7 is a perspective view which shows the third modification of the laser diode in FIG. 1.

FIG. 7 shows a third modification of the heterojunction laser diode in FIG. 1.

Grooves 34 are formed in parallel in the n-GaAs substrate 14 for increasing the resistance of the n-GaAs substrate 14. Higher resistance rod members may be inserted into the grooves 34.

The resistance layer (i.e., the substrate 14) may be formed with laminates.

The laser diode substrate 2 is made of GaAs-AlGaAs based materials, but may alternatively be made of InP-InGaAsP based materials.

The upper electrode layer 12 may alternatively be made of Cr/Au laminates or Ti/Pt/Au laminates. The lower electrode layer 20 may alternatively be made of Au-Ge/Au laminates.

The resistance layers are not limited in material to n-GaAs and may be made of p-type conductive materials or another material such as a Si or an InP-based material or may be formed with an insulating member which is made of diamond or aluminum nitride and which is plated with a high-resistance material.

The soldering layer 25 used to join the laser diode chip 22 to the base 27 may alternatively be made of Sn-Pb based material, In-based material, or silver paste.

The resistance layer 14 may be greater or smaller in size than the laser diode chip 22.

Figure 8:
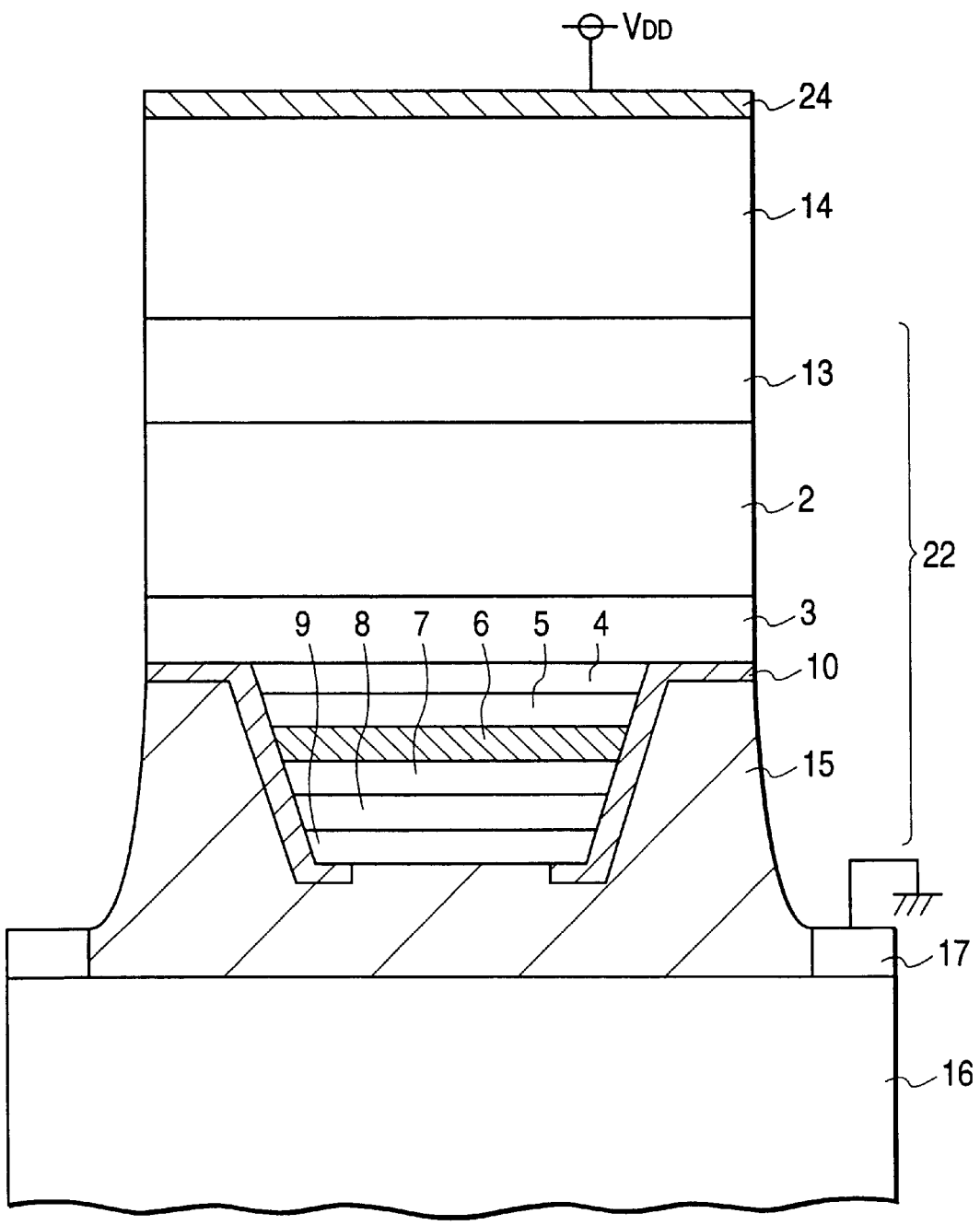
FIG. 8 is a longitudinal sectional view which shows the fourth modification of the laser diode in FIG. 1.

The laser diode may have a junction-down (upside-down) structure, as shown in FIG. 8, wherein the laser diode chip 22 is joined to the block 16 with the mesa thereof facing thereto.

Figure 9:
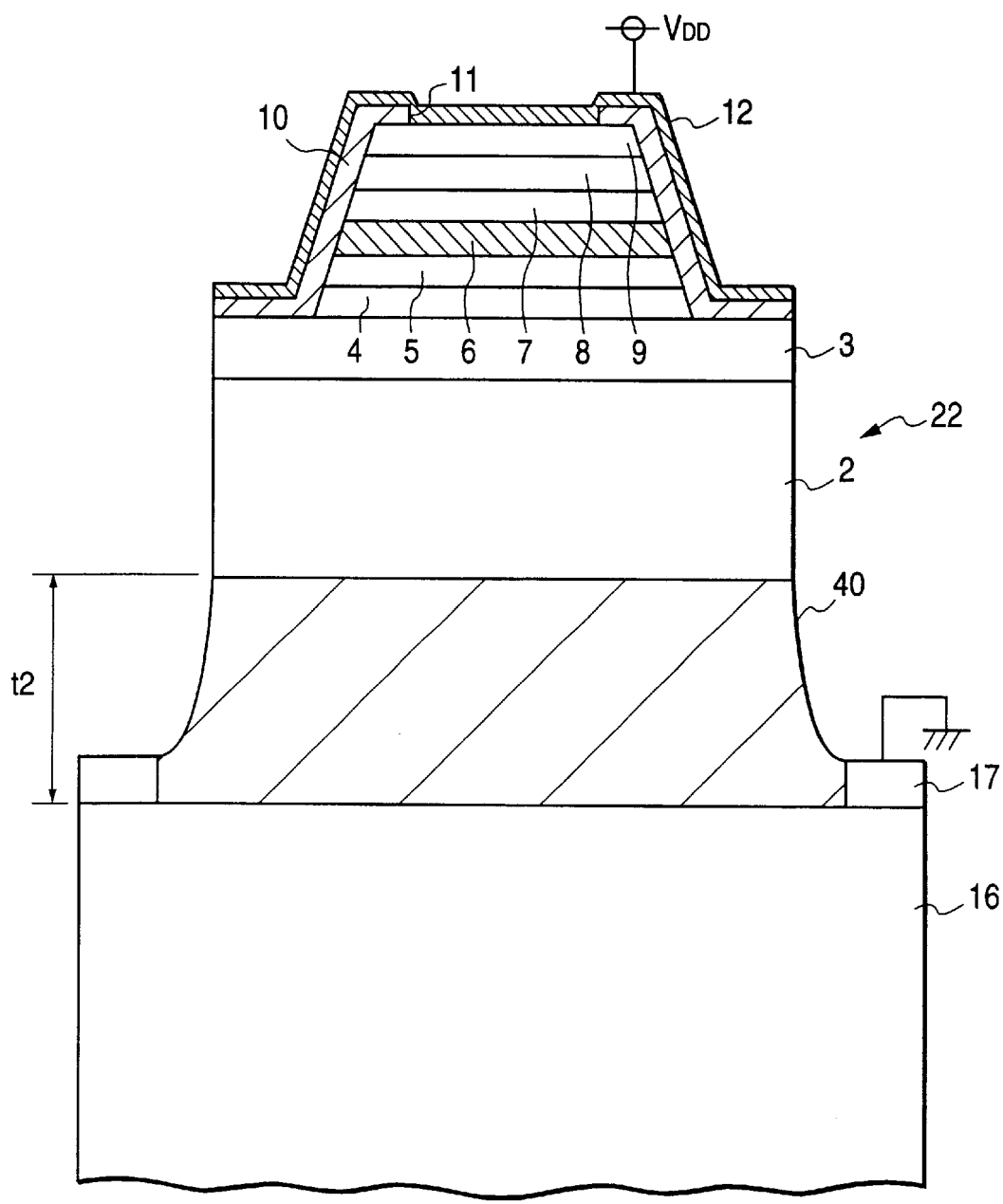
FIG. 9 is a longitudinal sectional view which shows the second embodiment of the invention.

FIG. 9 shows a laser diode of the second embodiment.

Figure 10:
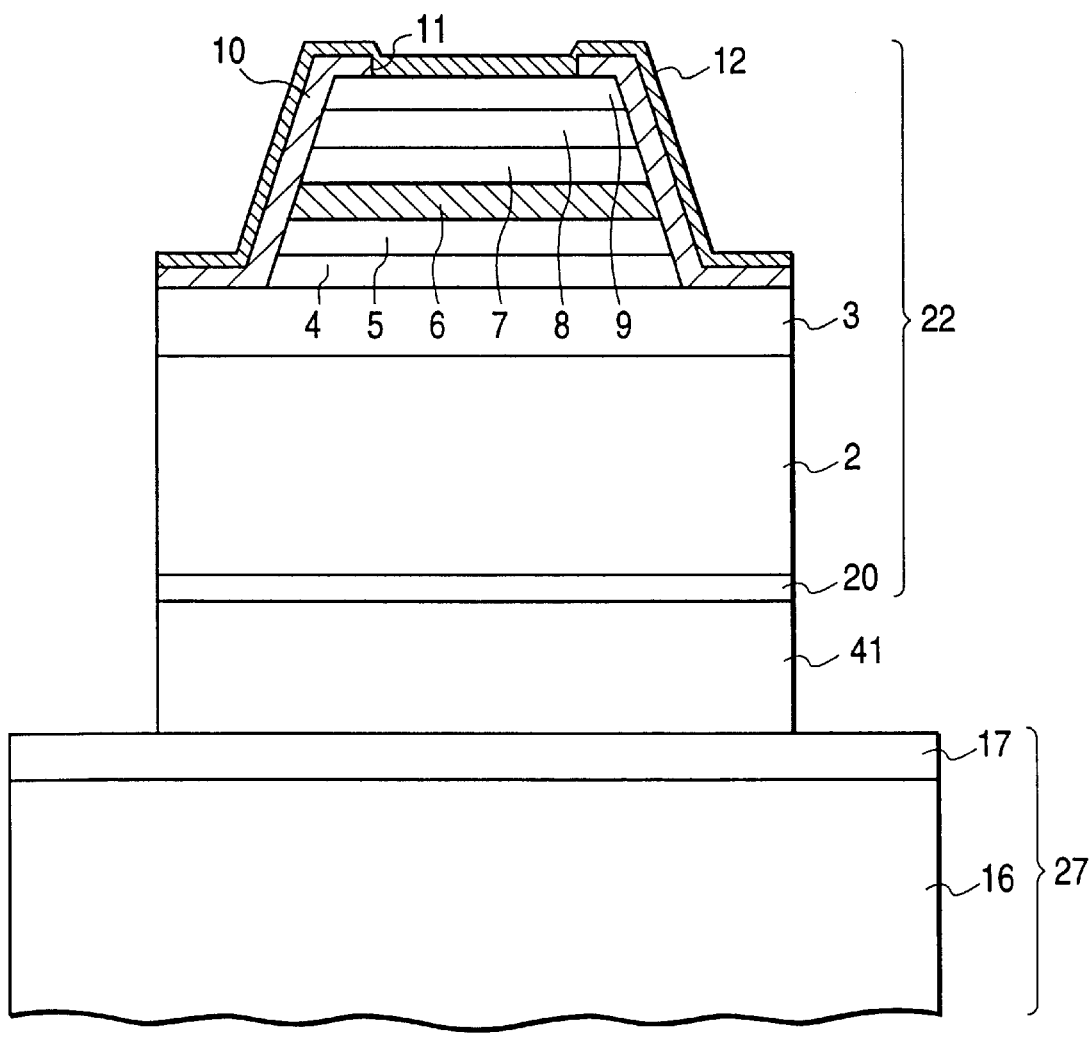
FIG. 10 is a longitudinal sectional view for explaining a manufacturing process of the laser diode in FIG. 9.

An alloy layer 40 is disposed on the bottom of the n-GaAs substrate 2 to serve as a junction layer to join the substrate 2 to a Cu-made block 16. The alloy layer 40 has a thickness $t_2$ of 20 μm or more and a resistance of 1 mΩ or more and is formed, as shown in FIG. 10, by joining the laser diode chip 22 through a 25 μm-thick Au-Sn soldering film 41 onto a base 27 consisting of the Cu-made block 16 and a gold-plated layer 17. The interposition of the Au-Sn soldering film 41 between the laser diode chip 22 and the base 27 provides a resistance of 1 mΩ or more to the alloy layer 40.

Other arrangements are identical with those of the first embodiment and the modifications thereof, and explanation thereof in detail will be omitted there.

Figure 11:
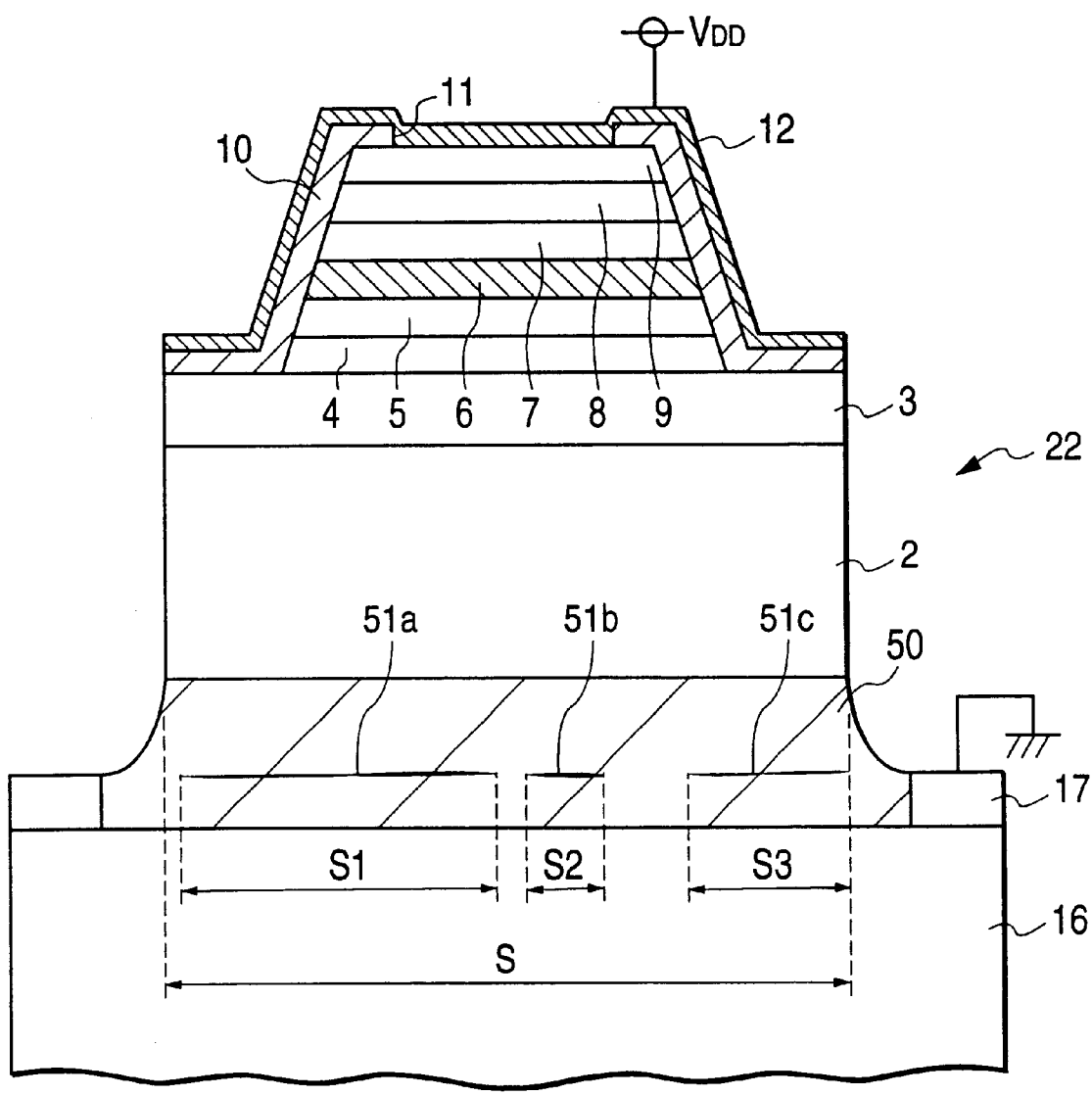
FIG. 11 is a longitudinal sectional view which shows the third embodiment of the invention.

FIG. 11 shows a laser diode of the third embodiment.

Figure 12:
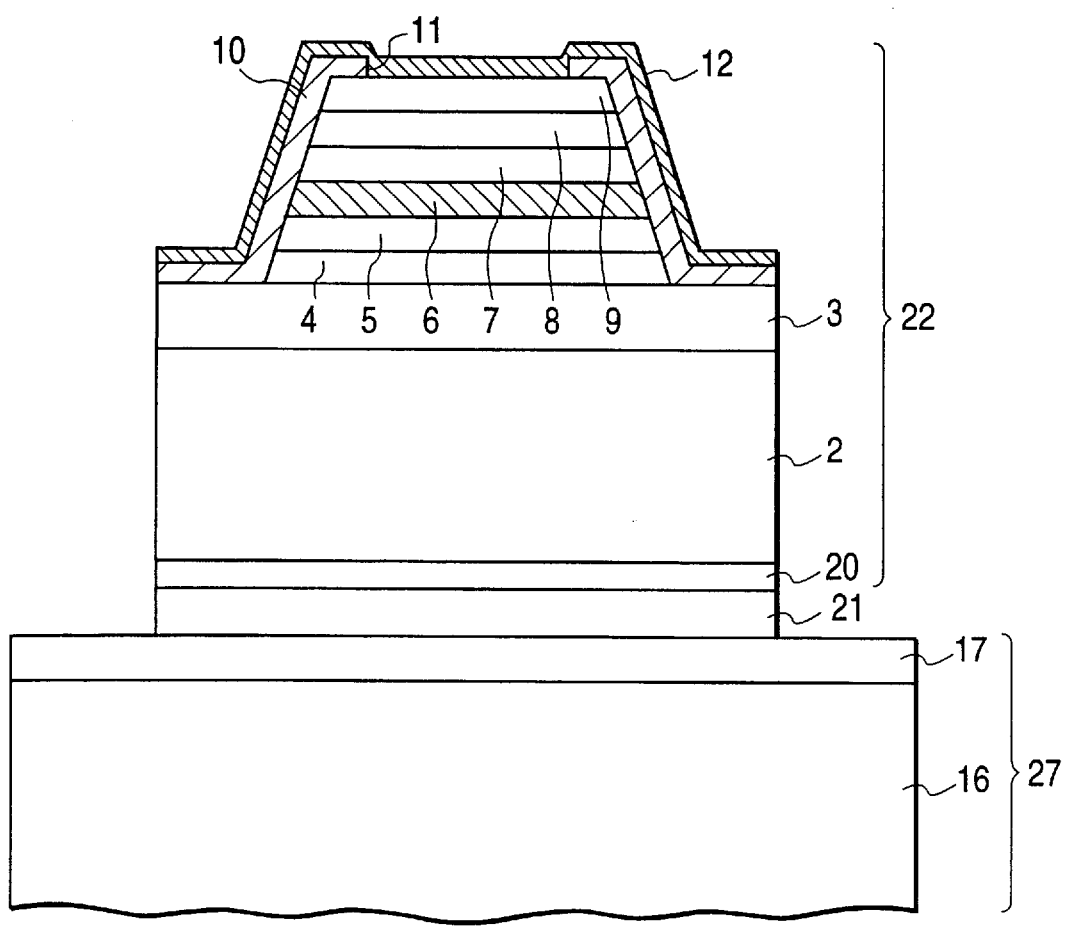
FIG. 12 is a longitudinal sectional view for explaining a manufacturing process of the laser diode in FIG. 11.

An alloy layer 50 which has formed therein non-junctions 51a, 51b, and 51c is disposed on the bottom of the n-GaAs substrate 2. The total area (S1+S2+S3) of the non-junctions 51a, 51b, and 51c occupies 90% or more of the area S of the bottom of the n-GaAs substrate 2 ((S1+S2+S3)/S ≧ 90%). The alloy layer 50 is, as shown in FIG. 12, formed by joining the laser diode chip 22 through the AuSn soldering film 21 to the base 27 consisting of the Cu-made block 16 and the gold-plated layer 17. The joining is performed at 300° C. in order to leave the non-junctions 51a to 51c in the alloy layer 50. If the laser diode chip 22 and the gold-plated layer 17 of the base 27 are joined through the soldering film 21 at about 350° C., then they are alloyed entirely.

The presence of the non-junctions 51a to 51c decreases a joined area of the laser diode chip 22 and the base 27 in the alloy layer 50, thereby resulting in an increased resistance of the alloy layer 50 greater than or equal to 1 mΩ.

Figure 13:
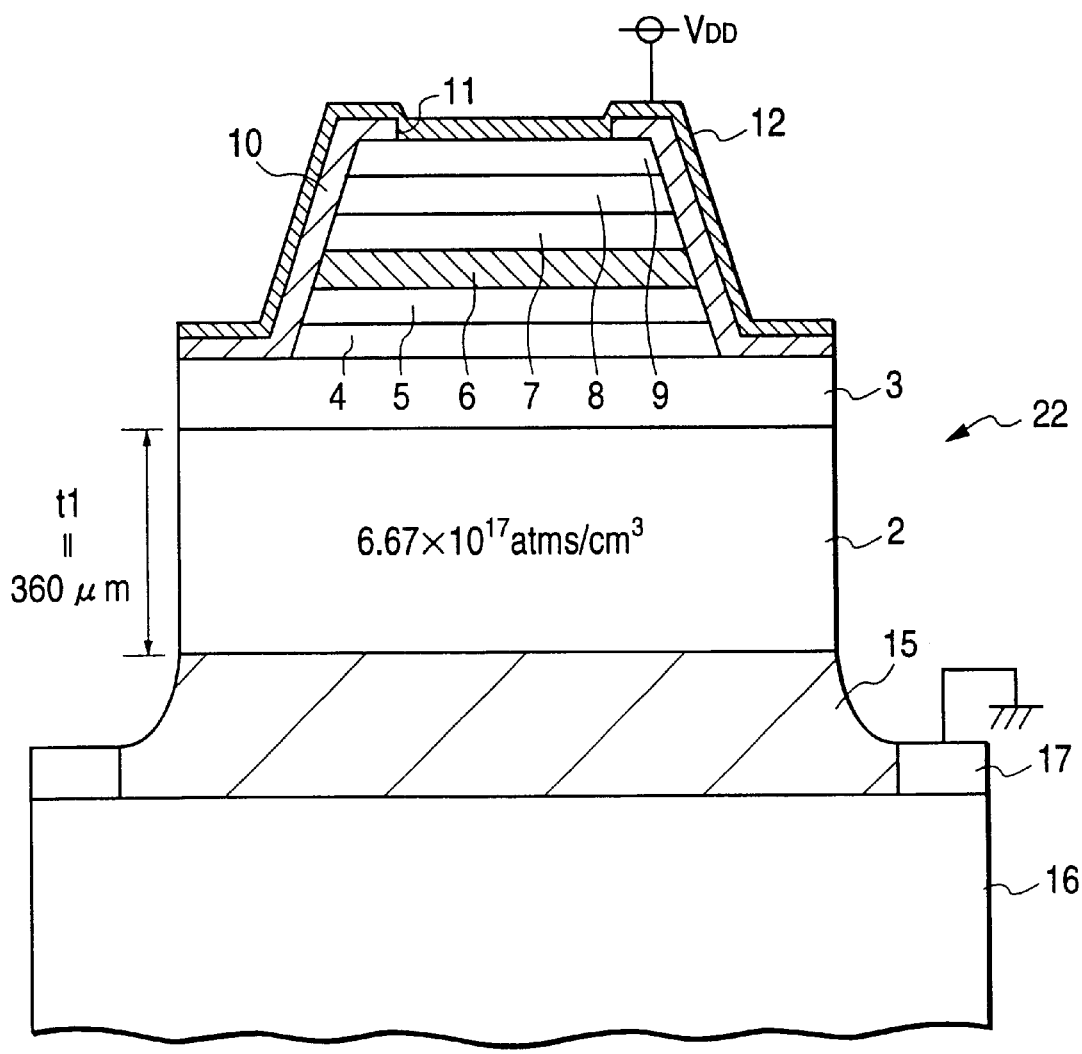
FIG. 13 is a longitudinal sectional view which shows the fourth an embodiment of the invention.

FIG. 13 shows a laser diode of the fourth embodiment which is different from the first embodiment in the concentration of impurities in the n-GaAs substrate 2 made of a base material of the laser diode chip 22 and the absence of the alloy layer 13 and the substrate 14.

Specifically, while the n-GaAs substrate 2 in the first embodiment contains impurities of $2 \times 10^{18}$ atms/cm$^3$, the n-GaAs substrate 2 in this embodiment contains impurities of $6.67 \times 10^{17}$ atms/cm$^3$ to have a high resistance of 1 mΩ or more. This provides the same effect as that in the first embodiment.

The increase in resistance of the substrate 2 may alternatively be achieved by increasing the thickness $t_1$ thereof to 360 μm.

Figure 14:
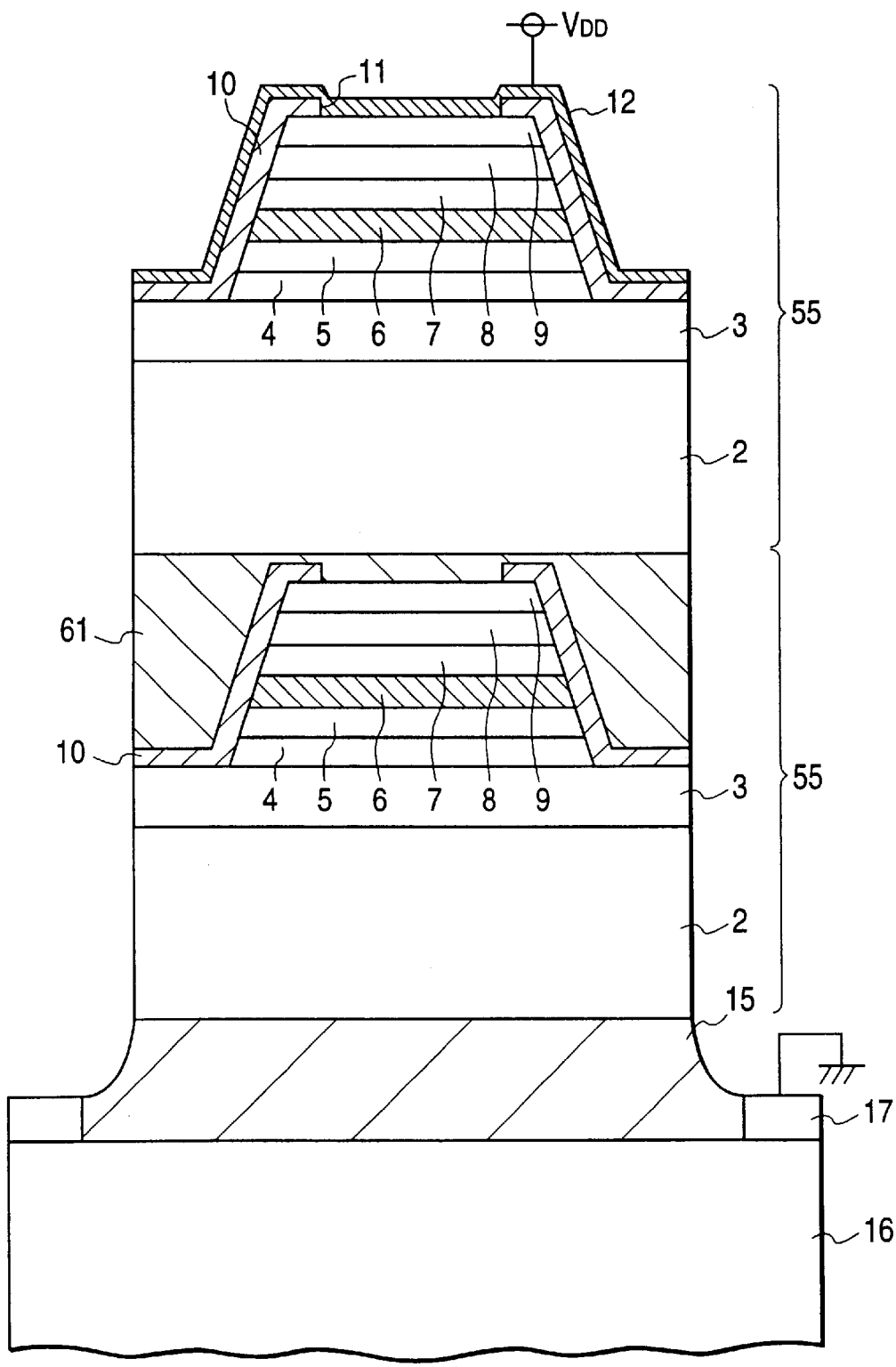
FIG. 14 is a longitudinal sectional view which shows a modification of the laser diode in FIG. 13.

FIG. 14 shows a modification of the fourth embodiment which has vertically piled laser diode chips 55 each identical with the one shown in FIG. 13. In this modification, the lower one of the laser diode chips 55 serves as a resistance layer like the n-GaAs substrate 14 in the first embodiment.

Figure 15:
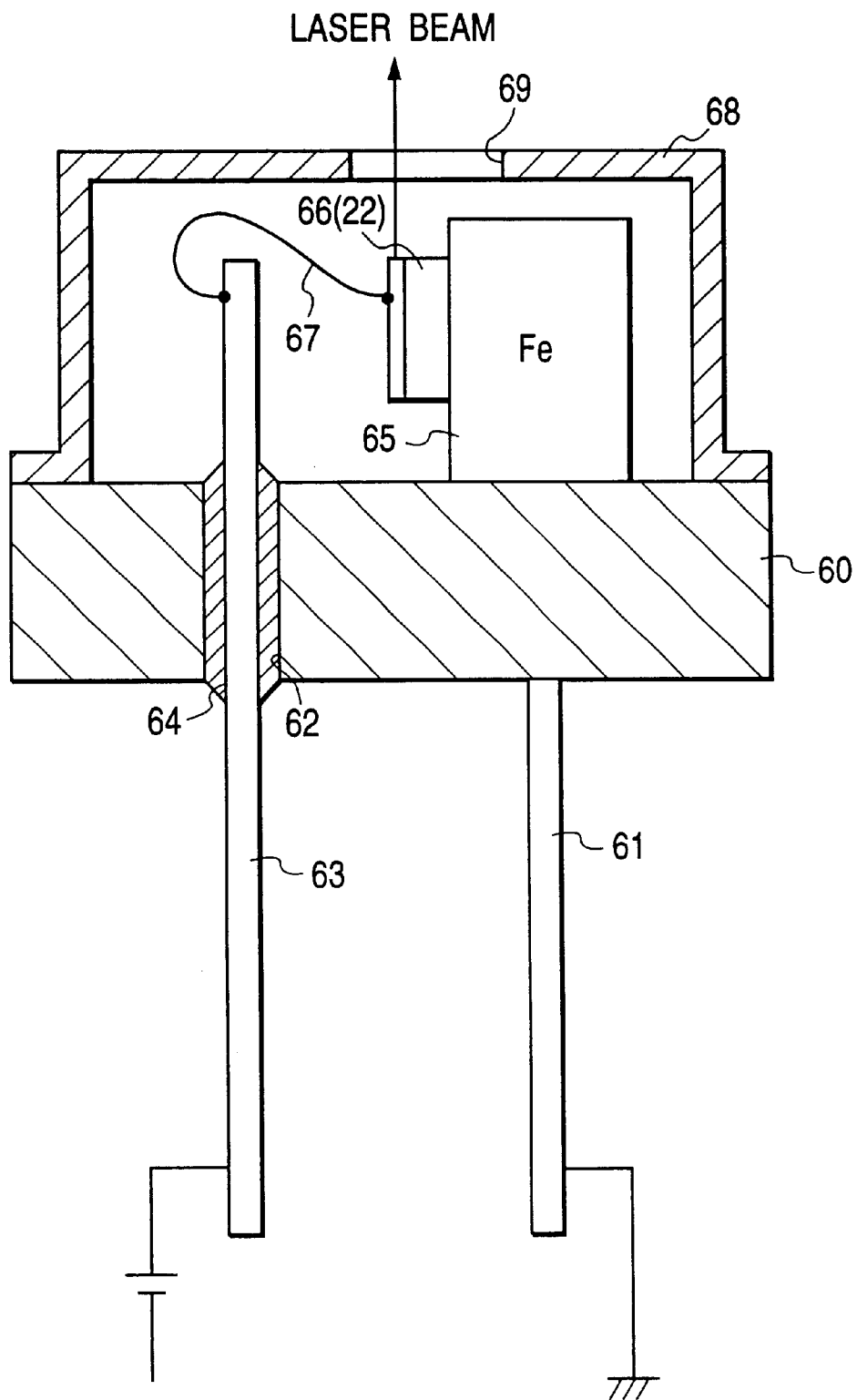
FIG. 15 is a longitudinal sectional view which shows a radar system equipped with a laser diode according to the fifth embodiment of the invention.
Figure 16:
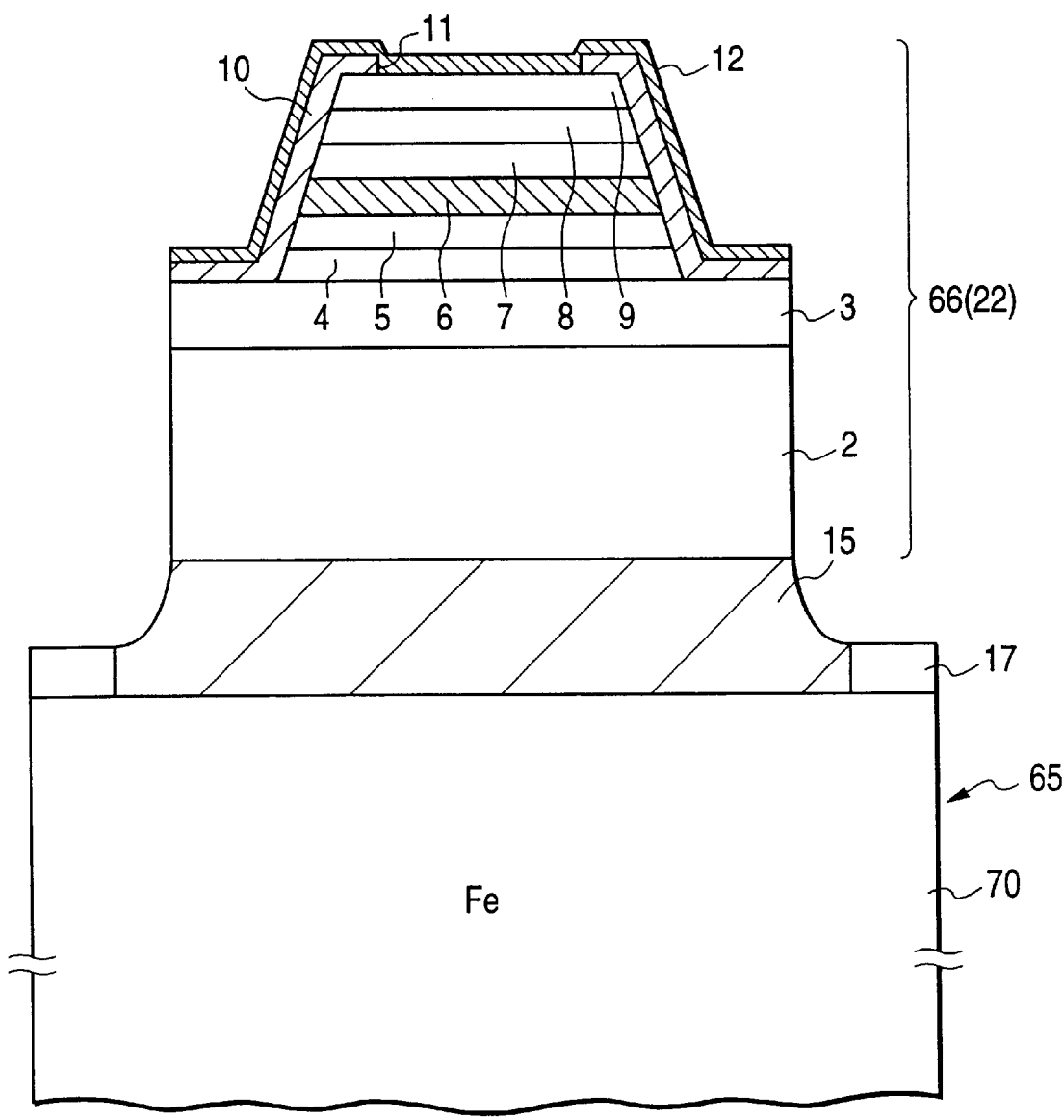
FIG. 16 is a longitudinal sectional view which shows the laser diode used in the radar system of FIG. 15.

FIG. 15 shows a radar system equipped with a laser diode of the fifth embodiment as shown in FIG. 16.

The radar system includes the laser diode chip 66 mounted on a Cu-made stem 60 through a base 65. The stem 60 has disposed therein lead pins 61 and 63. The lead pin 63 is inserted into a hole 62 in the stem 60 and hermetically sealed with glass 64. The lead pin 63 and the laser diode chip 66 are connected through a wire 67. The base 65 and the laser diode chip 66 are covered with an aluminum cap 68. The lead pin 61 is connected to ground. The lead pin 63 is supplied with the pulse voltage. The lead pin 61, the stem 60, the base 65, the laser diode chip 66, the wire 67, and the lead pin 63 form an electric circuit. When the pulse voltage is applied to the lead pin 60, the laser diode chip 66 emits a laser beam out of a window 69 formed in the cap 68.

The base 65, as shown in FIG. 16, includes a block 70 and a gold-plated layer 17 to which the laser diode chip 66 is joined The block 70 is made of Fe to have an electric resistance of 1 mΩ or more which is higher than that of a Cu-made block like the block 16 in FIG. 2. This provides the same effect as that in the first embodiment.

Moreover, the Fe-made base 65 has substantially the same coefficient of thermal expansion as that of the n-GaAs substrate 2, thereby reducing the thermal stress acting on the substrate 2 and the base 65 when soldered together.

Figure 17:
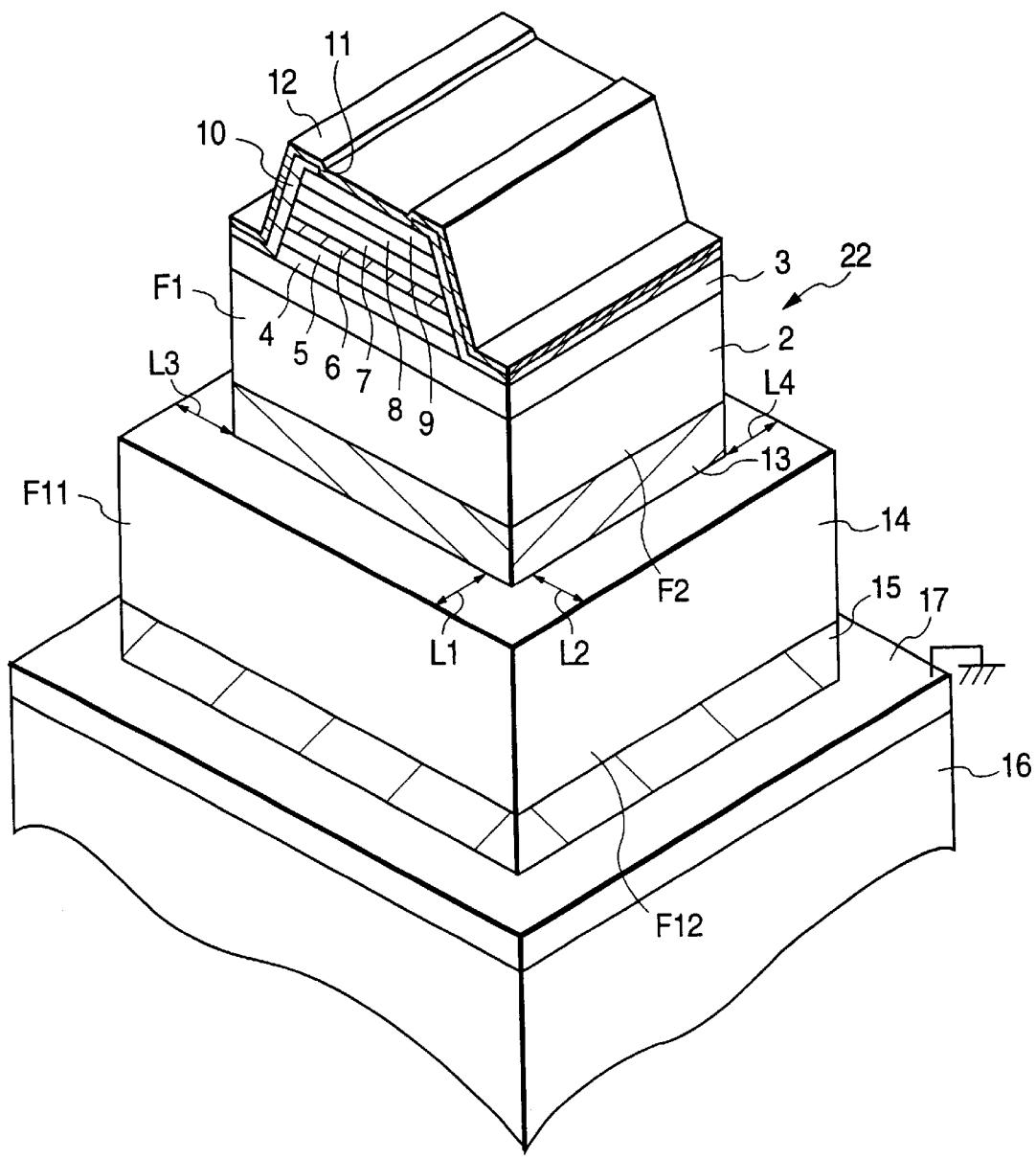
FIG. 17 is a longitudinal sectional view which shows the sixth embodiment of the invention.

FIG. 17 shows a laser diode of the sixth embodiment.

Like the first embodiment, the n-GaAs substrate 14 is joined to the bottom of the n-GaAs substrate 2 through the alloy layer 13, and the Cu-made block 16 is joined to the bottom of the n-GaAs substrate 14 through the alloy layer 15. The n-GaAs substrate 14 has a thickness of 240 μm. The alloy layer 13 is connected to ground through the n-GaAs substrate 14 having a resistance of 1 mΩ or more, the alloy layer 15, and the gold-plated layer 17 on the block 16.

Both the n-GaAs substrate 2 and the n-GaAs substrate 14 are rectangular parallelepipeds. The n-GaAs substrate 14 is greater in area than the laser diode chip 22 and is arranged in alignment of a vertical center line thereof with that of the laser diode chip 22. Specifically, sides of the n-GaAs substrate 14 extend parallel to those of the laser diode chip 22. This will be discussed in more detail below.

Figure 18:
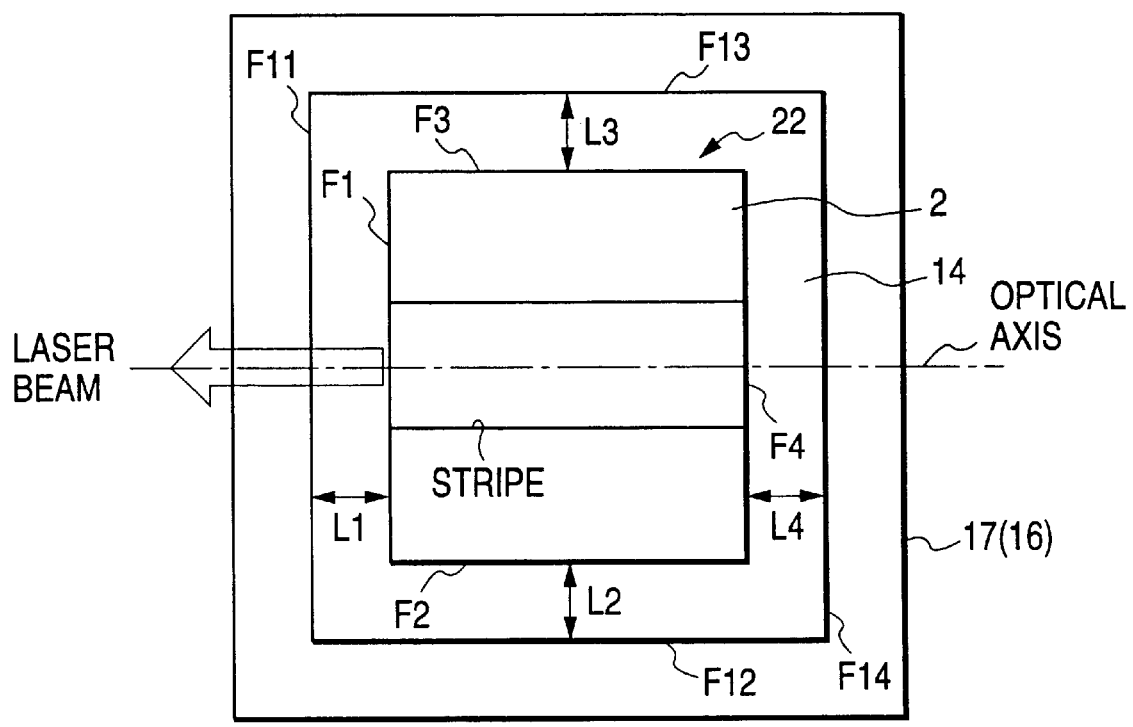
FIG. 18 is a plan view which shows a laser diode in FIG. 17.

In the following discussion, a wall of the laser diode chip 22 from which a laser beam is outputted is, as shown in FIG. 18, referred to as a front wall F1, walls neighboring the front wall F1 are referred to as side walls F2 and F3, respectively, and a wall opposite the front wall F1 is referred to as a rear wall F4. Similarly, a wall of the n-GaAs substrate 14 oriented to the same direction as that of the front wall F1 is referred to as a front wall F11, walls neighboring the front wall F11 are referred to as side walls F12 and F13, respectively, and a wall opposite the front wall F11 is referred to as a rear wall F14.

The front wall F11 of the n-GaAs substrate 14 is located outward at a distance L1 from the front wall F1 of the laser diode chip 22. The side wall F12 of the n-GaAs substrate 14 is located outward at a distance L2 (=L1) from the side wall F2 of the laser diode chip 22. The side wall F13 of the n-GaAs substrate 14 is located outward at a distance L3 (=L1=F2) from the side wall F3 of the laser diode chip 22. The rear wall F14 of the n-GaAs substrate 14 is located outward at a distance L4 (=L1=L2=L3) from the rear wall F4 of the laser diode chip 22.

Specifically, all the walls F11 to F14 of the n-GaAs substrate 14 lie outside the walls F1 to F4 of the laser diode chip 22. In other words, the n-GaAs substrate 14 is longer than the laser diode chip 22 in an optical axis direction and also wider than the laser diode chip 22 in a direction perpendicular to the optical axis.

Figure 19:
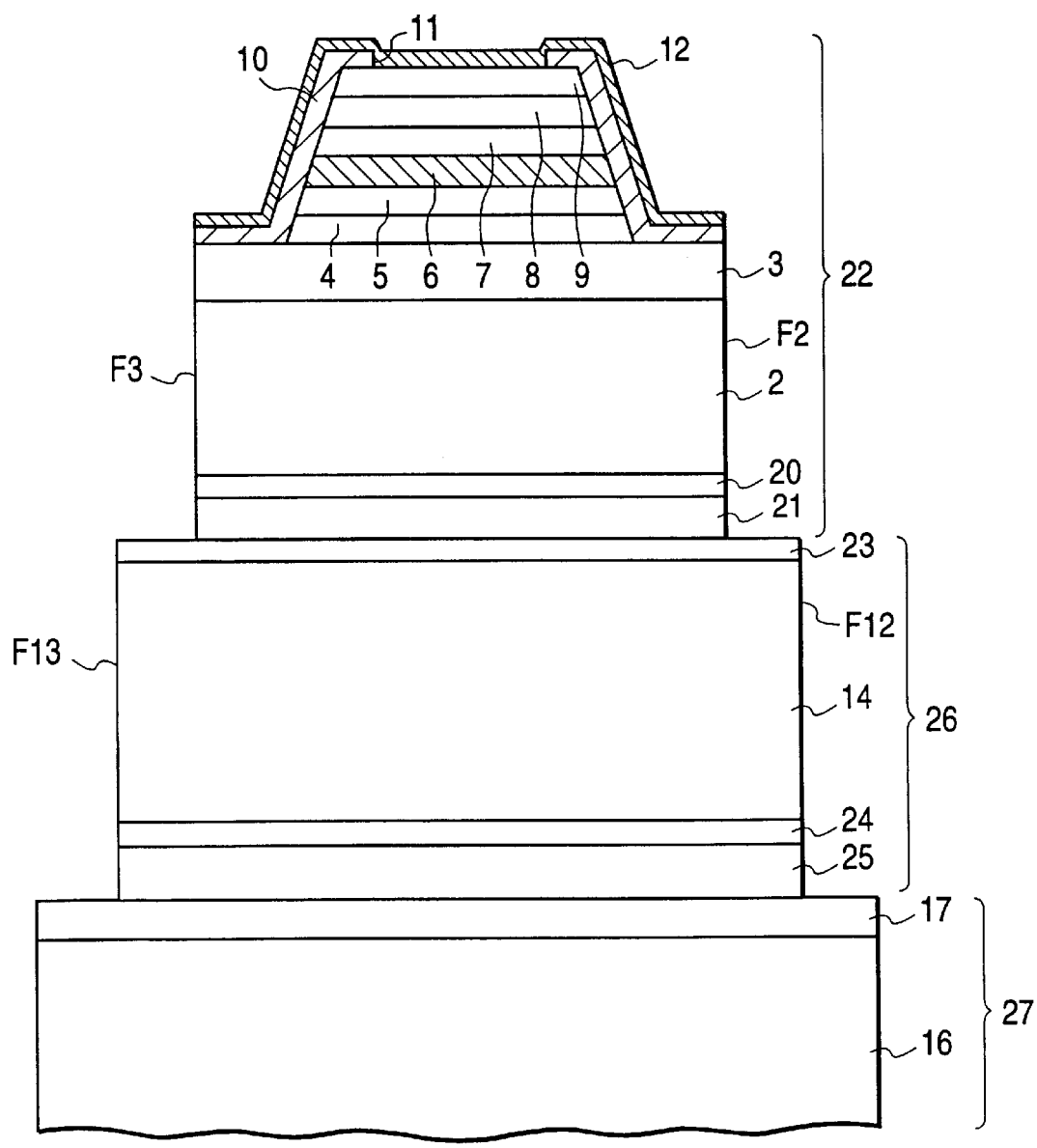
FIG. 19 is a longitudinal sectional view for explaining a manufacturing process of a laser diode in FIG. 17.

A manufacturing method of the laser diode of this embodiment will be described below with reference to FIG. 19.

First, on the n-GaAs substrate 2, the n-GaAs layer 3, the n-$Al_{0.4}Ga_{0.6}As$ clad layer 4, the n-$Al_{0.2}Ga_{0.8}As$ optical guide layer 5, the $Al_{0.2}Ga_{0.8}As$/GaAs active layer 6, the p-$Al_{0.2}Ga_{0.8}As$ optical guide layer 7, the p-$Al_{0.4}Ga_{0.6}As$ clad layer 8, and the p-GaAs contact layer 9 are laminated in sequence, after which the mesa is formed by etching.

On upper surfaces of the n-GaAs layer 3 and the mesa, a layer of $SiO_2$ (i.e., the insulating layers 10) is deposited by plasma CVD techniques, and then a central portion thereof is chemically etched away to form the window 11. On the insulating layers 10, the upper electrode layer 12 made of Cr/Pt/Au laminates is formed. On the bottom of the n-GaAs substrate 2, an electrode layer 20 is laminated with Au-Ge/Ni/Au. These layers are then subjected to an alloy process to form ohmic contacts with the electrode layers 12 and 20. On the electrode layer 20, a soldering layer 21 made of Au-Sn is vapor deposited. End walls of the thus formed block are cleaved to complete the laser diode chip 22.

The n-GaAs substrate 14 which is greater in size than the nGaAs substrate 2 is prepared. An electrode layer 23 is formed with Cr/Pt/Au laminates on an upper surface of the n-GaAs substrate 14, while on a lower surface of the n-GaAs substrate 14, an electrode layer 24 is formed with Au-Ge/Ni/Au laminates. These layers are then subjected to an alloy process at 350° C. for two minutes to form ohmic contacts with the electrode layers 23 and 24. Subsequently, a soldering layer 25 made of Au-Sn is deposited on the electrode layer 24 to complete a resistance layer 26.

Finally, a base 27 consisting of the Cu-made block 16 and the gold-plated layer 17 is prepared. The laser diode chip 22 is joined to the resistance layer 26 and the gold-plated layer 17 in sequence by the die bonding.

Figure 20:
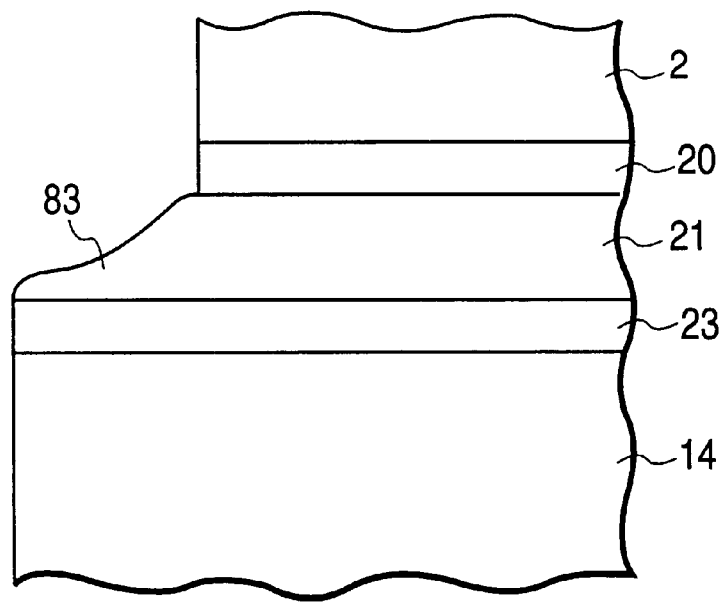
FIG. 20 is a partially sectional view which shows a junction of a laser diode chip and a substrate in the sixth embodiment.
Figure 21:
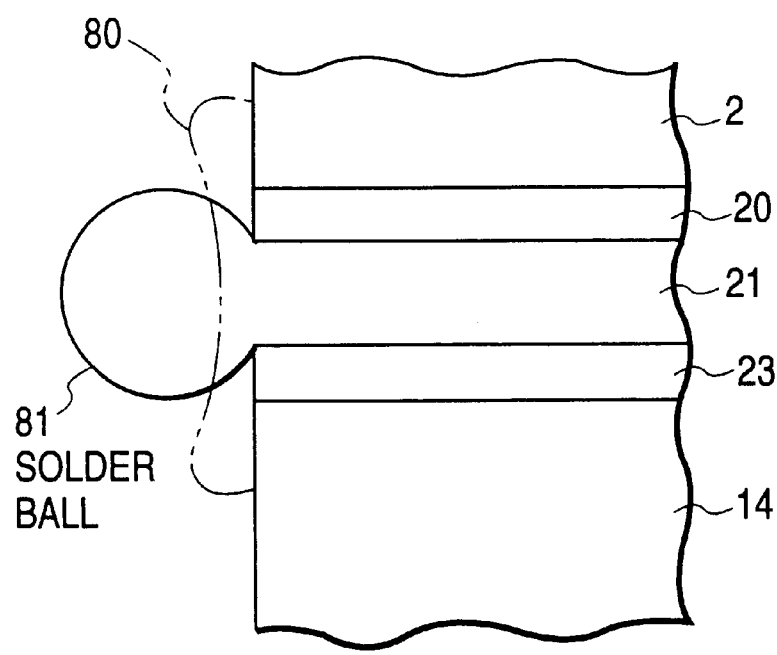
FIG. 21 is a view for explaining a junction of a laser diode chip and a substrate when side walls of the laser diode chip are arranged in alignment with side walls of the substrate.
Figure 22:
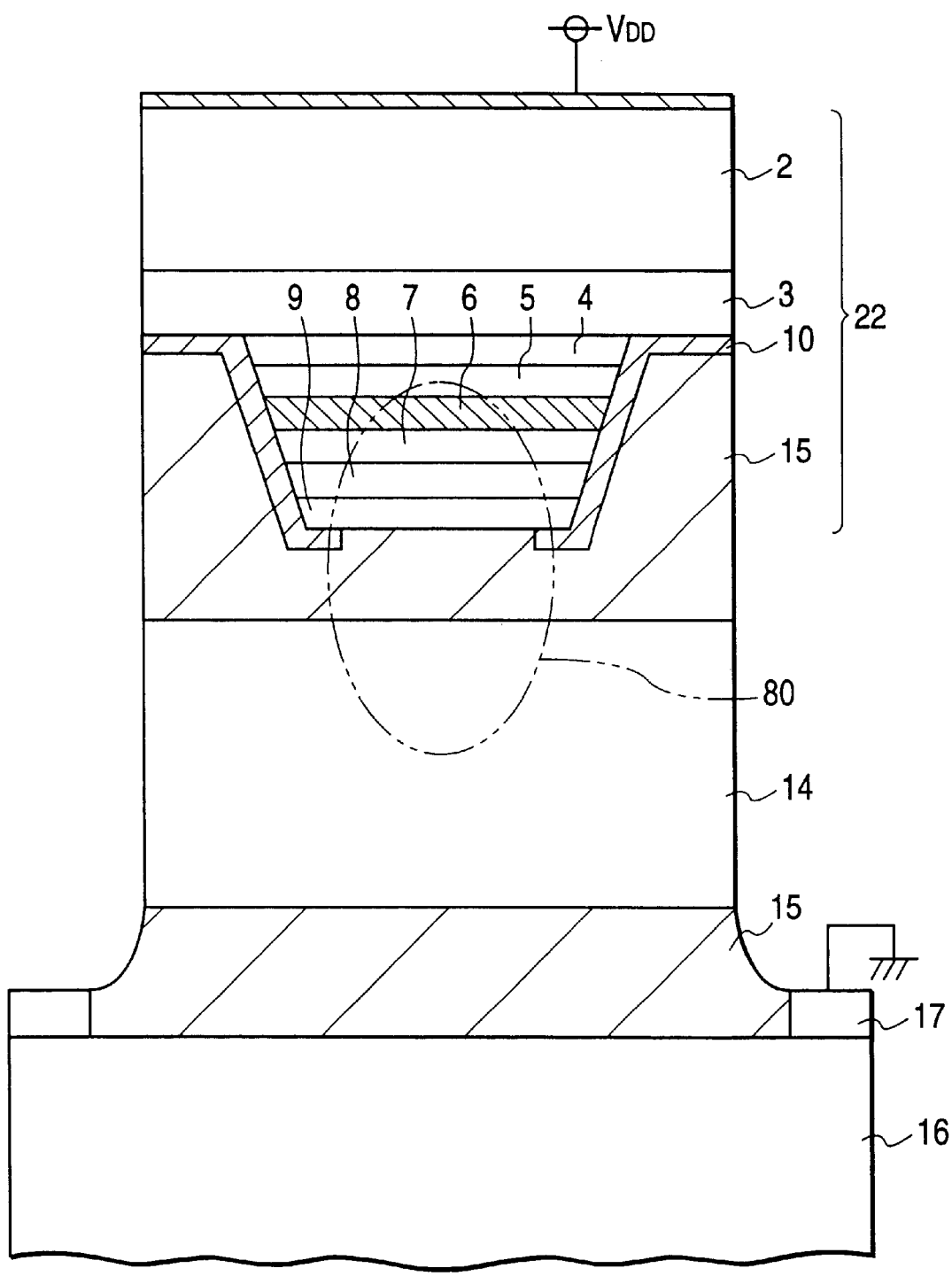
FIG. 22 is a view for explaining a short-circuit produced in a structure of FIG. 21.

The joining of the laser diode chip 22 and the resistance layer 26 is achieved with the soldering layer 21. When the solder layer 21 is melted, the solder stays, as shown in FIG. 20, on the substrate 14, without flowing over the side walls of the substrates 2 and 14. Specifically, the location of the walls F1 to F4 of the laser diode chip 22 inside the walls F11 to F14 of the n-GaAs substrate 14 prevents a portion of melted solder from flowing out of the soldering layer 21, as illustrated at numeral 80 in FIG. 21, which may adversely affect the operation of the laser diode chip 22 or from being separated from the soldering layer 21 in the form of a ball, as illustrated at numeral 81, which may roll in a diode package and collide with the laser diode chip 22 to damage it or which may be stuck to the front wall F1 of the laser diode chip 22, causing the intensity of a laser beam to be decreased. Particularly, in the case of a laser diode, as shown in FIG. 22, wherein the laser diode chip 22 is disposed upside down, the portion 80 of the melted solder flowing out the soldering layer 21 would cause a short-circuit between the laser diode chip 22 and the substrate 14.

When the laser diode chip 22 and the resistance layer 26 are joined through the soldering layer 21, it will cause the lower electrode layer 20 of the laser diode chip 22 and the upper electrode layer 23 of the resistance layer 26 to be alloyed with the soldering layer 21 to form the alloy layer 13. Similarly, when the resistance layer 26 and the base 27 are joined through the soldering layer 25, it will cause the lower electrode layer 24 of the resistance layer 26 and the gold-plated layer 17 on the base 27 to be alloyed with the soldering layer 25 to form the alloy layer 15.

Figure 23:
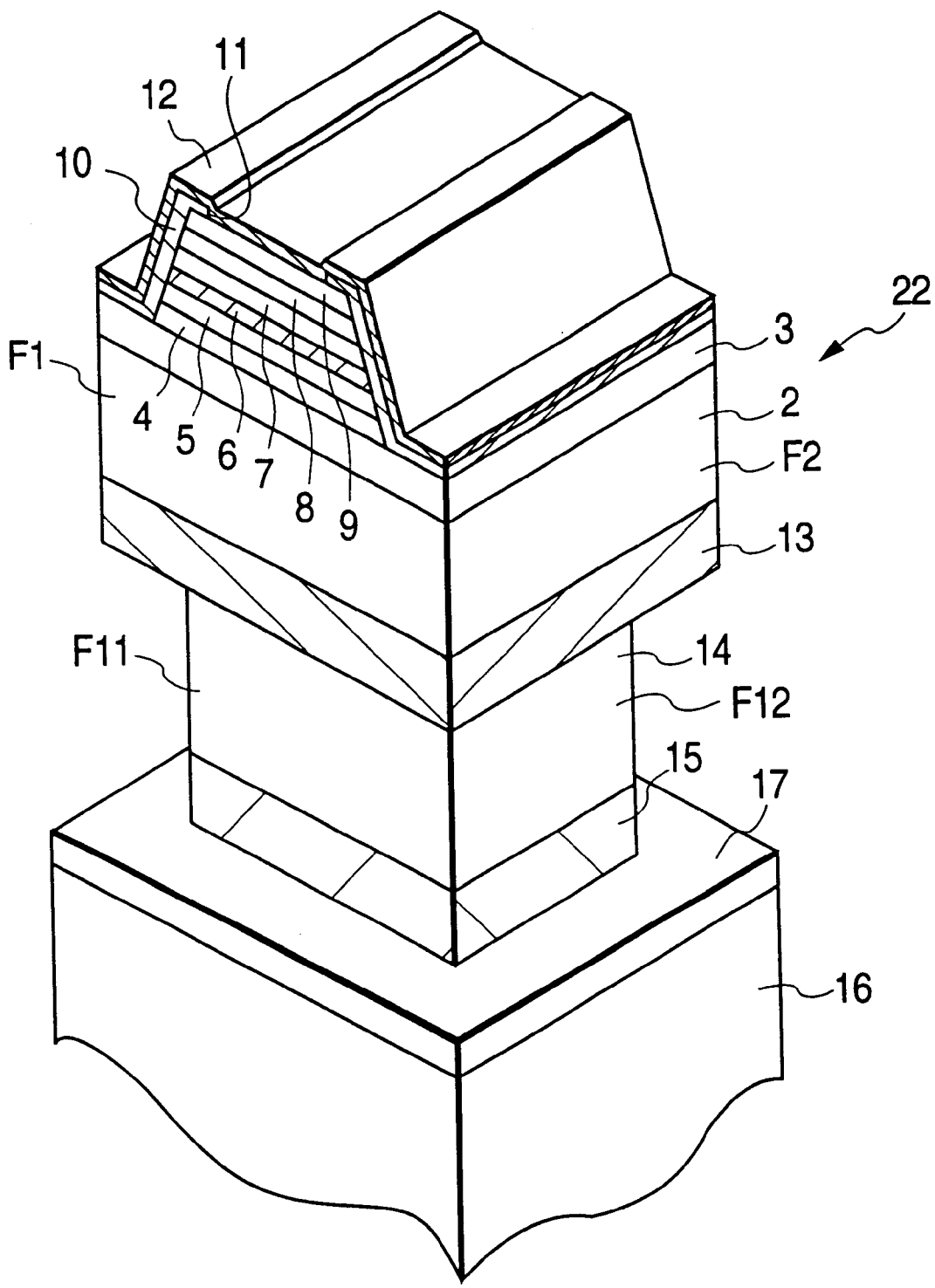
FIG. 23 is a perspective view which shows a modification of the sixth embodiment.
Figure 24:
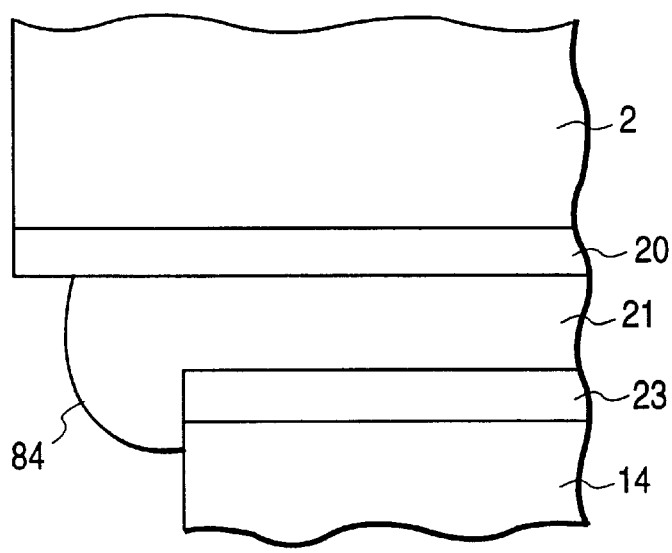
FIG. 24 is a view for explaining soldering of a laser diode chip and a substrate in the sixth embodiment.

In the sixth embodiment, the four walls F1 to F4 of the laser diode chip 22 are all located inside the walls F11 to F14 of the n-GaAs substrate 14, however, somewhat similar effects as those offered by this embodiment may be obtained as long as at least one of the walls F1 to F4 lies inside corresponding one of the walls F11 to F14. The walls F1 to F4 of the laser diode chip 22 may alternatively be, as shown in FIG. 23, located outside the walls F11 to F14 of the n-GaAs substrate 14. In this case, a portion of melted solder flowing out of the soldering layer 21 is, as illustrated at 84 in FIG. 24, held at a corner of a step of the substrate 2 (i.e., the electrode layer 20) without being separated from the soldering layer 21.

Figure 25:
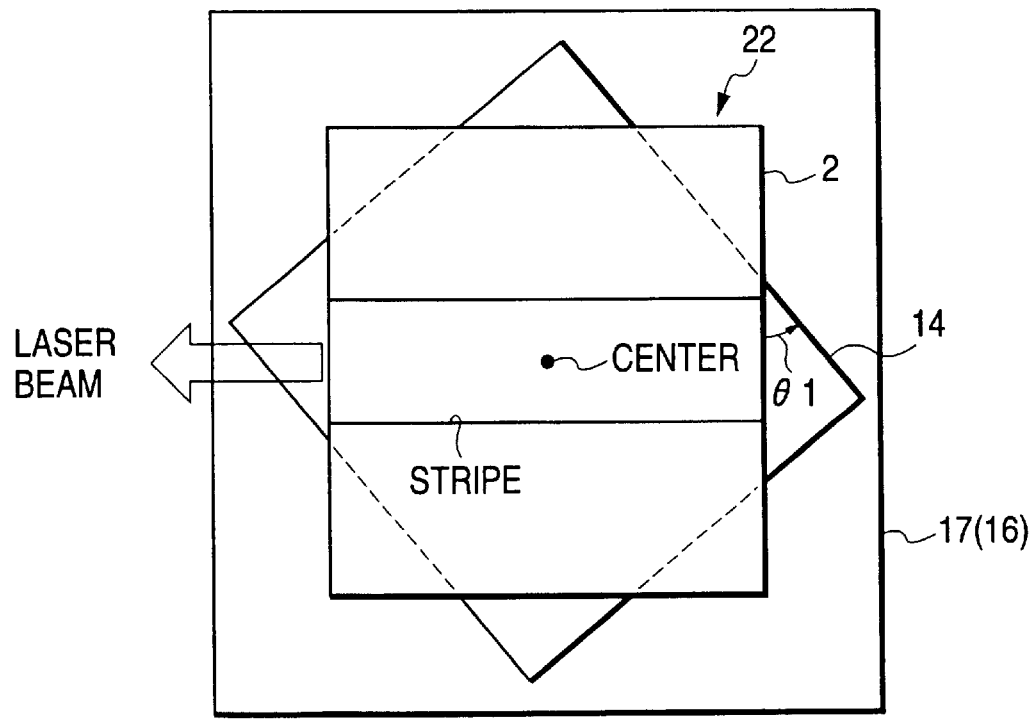
FIG. 25 is another modification of the sixth embodiment.
Figure 26:
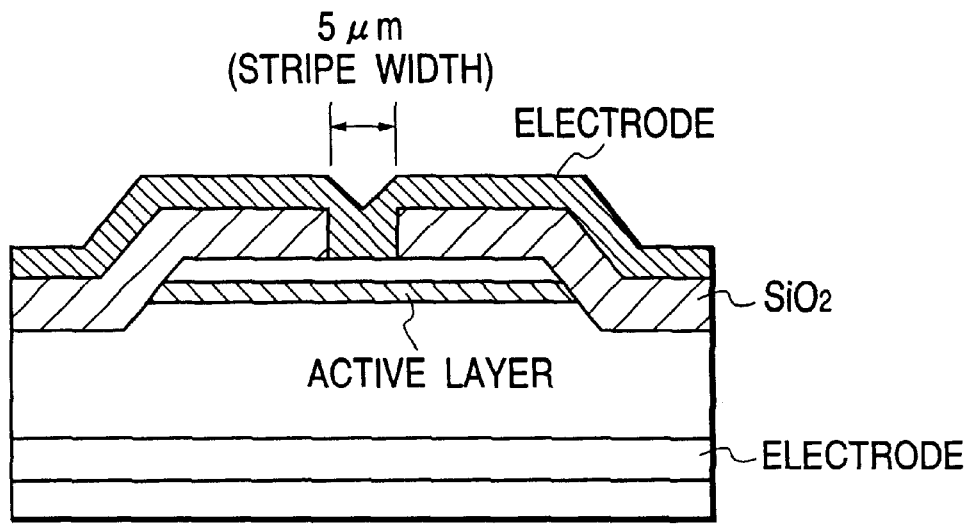
FIG. 26 is a longitudinal sectional view which shows a conventional lower power laser diode.
Figure 27:
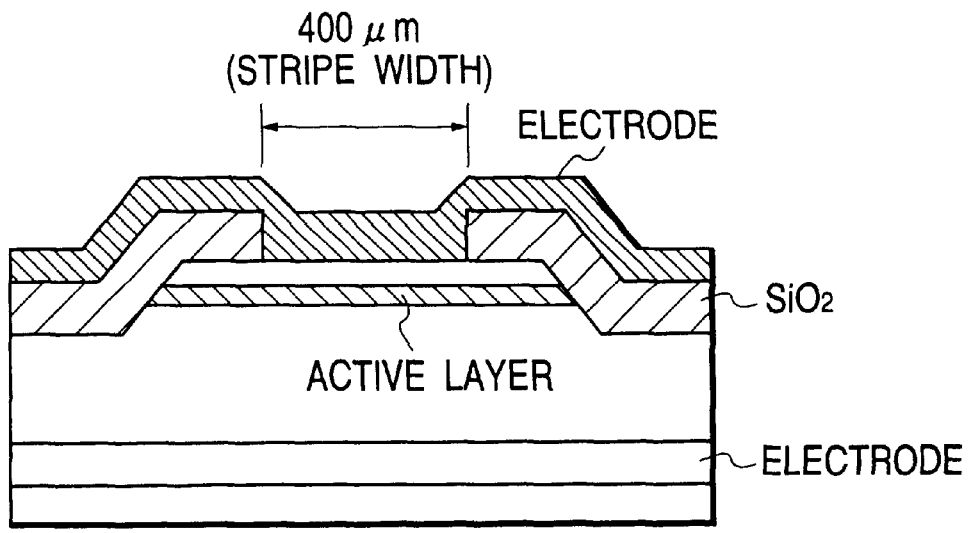
FIG. 27 is a longitudinal sectional view which shows a conventional high power laser diode.
Figure 28:
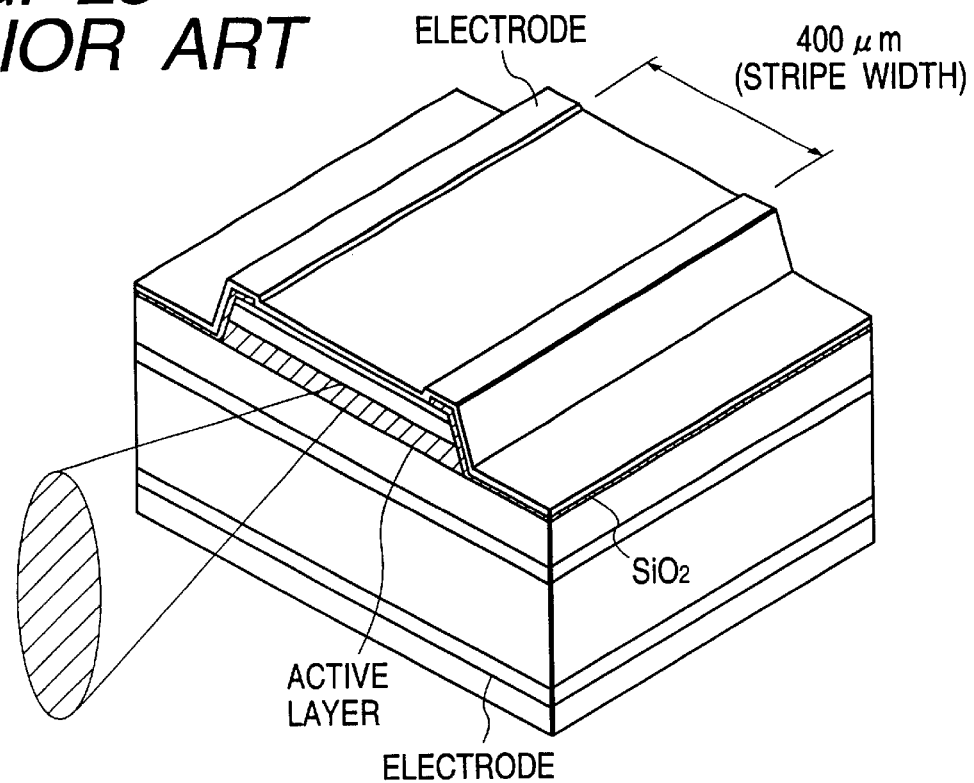
FIG. 28 is a perspective view which shows the high power laser diode of FIG. 27.

The n-GaAs substrate 14 may alternatively be, as shown in FIG. 25, shifted an angle θ horizontally from the laser diode chip 22. FIG. 25 illustrate for the case where the laser diode chip 22 and the substrate 14 are identical in shape and size and arranged so that center lines thereof may be aligned with each other.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims. For example, the present invention may be used with buried heterostructure laser diodes having the stripe-geometry.

What is claimed is:

1. A stripe-geometry heterojunction laser diode device having a stripe width of 100 µm or more comprising:
   a laser diode chip including:
      a first electrode layer connected to a voltage source,
      a second electrode layer connected to ground, and an active layer disposed between said first and second electrode layers to emit a laser beam when energized; and a resistance layer having a resistance ranging between 1 mΩ and 15 mΩ, said resistance layer forming a portion of an electric path extending from said first electrode layer to said second electrode layer through said active layer, wherein said resistance layer is made of a GaAs-based material.

2. A stripe-geometry heterojunction laser diode device having a stripe width of 100 μm or more comprising:

a laser diode chip including:
 a first electrode layer connected to a voltage source,
 a second electrode layer connected to ground, and
 an active layer disposed between said first and second electrode layers to emit a laser beam when energized; and a resistance layer having a resistance ranging between 1 mΩ and 15 mΩ, said resistance layer forming a portion of an electric path extending from said first electrode layer to said second electrode layer through said active layer, wherein a base material of said resistance layer is identical with a base material of said laser diode chip.

* * * * *